US011418161B2

(12) United States Patent
Parkes, Jr. et al.

(10) Patent No.: US 11,418,161 B2
(45) Date of Patent: Aug. 16, 2022

(54) TRANSCONDUCTANCE AMPLIFIER CIRCUITRY

(71) Applicant: Apple Inc., Cupertino, CA (US)

(72) Inventors: John J. Parkes, Jr., Chandler, AR (US); Krzysztof Babinski, Phoenix, AR (US)

(73) Assignee: Apple Inc., Cupertino, CA (US)

( * ) Notice: Subject to any disclaimer, the term of this patent is extended or adjusted under 35 U.S.C. 154(b) by 49 days.

(21) Appl. No.: 16/962,067

(22) PCT Filed: Mar. 27, 2018

(86) PCT No.: PCT/US2018/024592
§ 371 (c)(1),
(2) Date: Jul. 14, 2020

(87) PCT Pub. No.: WO2019/190480
PCT Pub. Date: Oct. 3, 2019

(65) Prior Publication Data
US 2020/0395906 A1    Dec. 17, 2020

(51) Int. Cl.
| H03F 3/45 | (2006.01) |
| H03F 1/56 | (2006.01) |
| H03F 3/195 | (2006.01) |
| H03M 1/18 | (2006.01) |

(52) U.S. Cl.
CPC ........... *H03F 3/45237* (2013.01); *H03F 1/56* (2013.01); *H03F 3/195* (2013.01); *H03M 1/182* (2013.01); *H03M 1/183* (2013.01); *H03F 2200/222* (2013.01); *H03F 2200/294* (2013.01); *H03F 2203/45438* (2013.01)

(58) Field of Classification Search
CPC ........ H03F 3/45237; H03F 1/56; H03F 3/195; H03F 2200/222; H03F 2200/294; H03F 2203/45438; H03M 1/182; H03M 1/183
USPC ................................ 330/127, 129, 252–261
See application file for complete search history.

(56) References Cited

U.S. PATENT DOCUMENTS

| 8,400,337 B1 | 3/2013 | Xu et al. |
| 2013/0141153 A1 | 6/2013 | Chang et al. |
| 2014/0022102 A1 | 1/2014 | Cho et al. |

FOREIGN PATENT DOCUMENTS

| JP | 2008-236281 | 10/2008 |
| KR | 10-2006-0023341 | 3/2006 |

*Primary Examiner* — Khanh V Nguyen
*Assistant Examiner* — Khiem D Nguyen
(74) *Attorney, Agent, or Firm* — Kowert, Hood, Munyon, Rankin & Goetzel, P.C.

(57) ABSTRACT

A digital to analog converter (DAC) can include a current mode DAC to receive an OC word from digital logic indicating an amount of current to add to or remove from sources of respective transistors of an amplifier and generate a current based on the OC word, an active output stage including a positive current mirror and a negative current mirror to generate a positive current and a negative current based on at least a portion of the generated current, and a plurality of outputs including a plurality of sink outputs and a plurality of source outputs to provide the positive and negative currents to the sources of the respective transistors.

20 Claims, 17 Drawing Sheets

| BW (MHz) | MODE | | | | | | | | | | | | |
|---|---|---|---|---|---|---|---|---|---|---|---|---|---|
| | | 6 | 7 | 8 | 9 | 10 | 11 | 12 | 13 | 14 | 15 | 16 | 18 |
| $X_1$ | $Y_1$ | 6 | 7 | 8 | 9 | 10 | 11 | 12 | 13 | 14 | 15 | 16 | 18 |
| $X_2$ | $Y_2$ | 22 | 24 | 25 | 26 | 27 | 28 | 29 | 30 | 31 | 32 | 33 | 35 |
| $X_3$ | $Y_3$ | 32 | 34 | 35 | 36 | 37 | 38 | 39 | 40 | 41 | 42 | 43 | 44 |
| $X_4$ | $Y_4$ | 49 | 50 | 51 | 52 | 53 | 54 | 55 | 56 | 57 | 58 | 59 | 60 |
| $X_5$ | $Y_5$ | 65 | 67 | 68 | 69 | 70 | 71 | 72 | 73 | 74 | 75 | 76 | 77 |
| $X_6$ | $Y_6$ | 72 | 73 | 74 | 75 | 76 | 77 | 78 | 79 | 80 | 81 | 82 | 83 |
| $X_7$ | $Y_7$ | 82 | 83 | 84 | 85 | 86 | 87 | 88 | 89 | 90 | 91 | 92 | 93 |
| $X_8$ | $Y_8$ | 88 | 89 | 90 | 91 | 92 | 93 | 94 | 95 | 96 | 97 | 98 | 99 |
| $X_9$ | $Y_9$ | 98 | 98 | 99 | 100 | 101 | 102 | 103 | 104 | 105 | 106 | 107 | 107 |
| $X_{10}$ | $Y_{10}$ | 106 | 106 | 107 | 108 | 109 | 110 | 111 | 112 | 113 | 113 | 114 | 114 |

RC VARIATION

FIG. 3

TRANSCONDUCTANCE AMPLIFIER CIRCUITRY

This application is a national stage application of PCT/US2018/024592, filed Mar. 27, 2018 which is incorporated herein by reference in its entirety.

TECHNICAL FIELD

Embodiments described herein pertain, in general, to improving operation of radio receiver and other circuitry systems. In some embodiments, the improvement is to an analog base band filter. In some embodiments, the improvement is to gain control circuitry. In some embodiments, the improvement is to direct current (DC) offset correction (DCOC) circuitry.

BACKGROUND

Transconductance amplifiers output a current proportional to an input voltage. Thus, the transconductance amplifier provides a voltage controlled current source. More specifically, an output current of a transconductance amplifier is proportional to a difference between two input voltages (a differential input voltage). These amplifiers are sometimes called differential transconductance amplifiers. The character, $g_m$, in "$g_m$ amplifier" represents transconductance. An input stage of the $g_m$ amplifier generally includes a differential pair. An output stage of the $g_m$ amplifier generally includes a current mirror. Operation of a $g_m$ amplifier is sensitive to transistor mismatch and load voltage. Improved operation of a $g_m$ amplifier and circuitry coupled to the $g_m$ amplifier are desired.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIG. 3 illustrates, by way of example, an embodiment of a lookup table (LUT).

DETAILED DESCRIPTION

In the following description, for purposes of explanation, numerous specific details are set forth in order to provide a thorough understanding of some example embodiments. It will be evident, however, to one skilled in the art, that the present disclosure may be practiced without these specific details.

This disclosure regards improvements to an analog baseband filter, gain control circuitry, or a DCOC digital to analog converter (DAC). Each of these improvements can be used independently of each other or with each other. Each of these improvements can be used independent from a $g_m$ amplifier. However, the improvements are often presented with regard to circuitry that includes a $g_m$ amplifier and how their operation affects operation of the $g_m$ amplifier.

Baseband Filter

One solution to tuning a baseband filter can include measuring an RC time constant using a copy of an original baseband filter. The RC time constant can then be used to adjust a trim of a capacitor of the original baseband filter. One problem with this solution is that the copy of the baseband filter consumes a prohibitively large area of a die. Further, the components of the copy of the baseband filter will not be identical to the corresponding components of the baseband filter. The components of the copy and the original will have slight variation at best and have differences in frequency response, impedance, and the like. Thus, the copy of the baseband filter, no matter how well it is matched to the original baseband filter, will have different operating characteristics. The difference in operating characteristics often causes the adjustment of the original baseband filter, based on the mismatching copy, to be inaccurate.

To overcome a problem associated with tuning the baseband filter in this manner, embodiments herein can bypass the baseband filter. A reference signal can be input to the amplifier. The amplifier output in response to a reference signal (e.g., a digitized version of the response of the amplifier from an analog to digital converter (ADC)) can be recorded as a target. The baseband filter can be switched back into an electrical path of an input and the reference signal can be reapplied to the input of the amplifier. The trim of a capacitor of the baseband filter can be adjusted until a desired response is achieved (based on the response of the amplifier when the baseband filter is bypassed).

Figure 1:
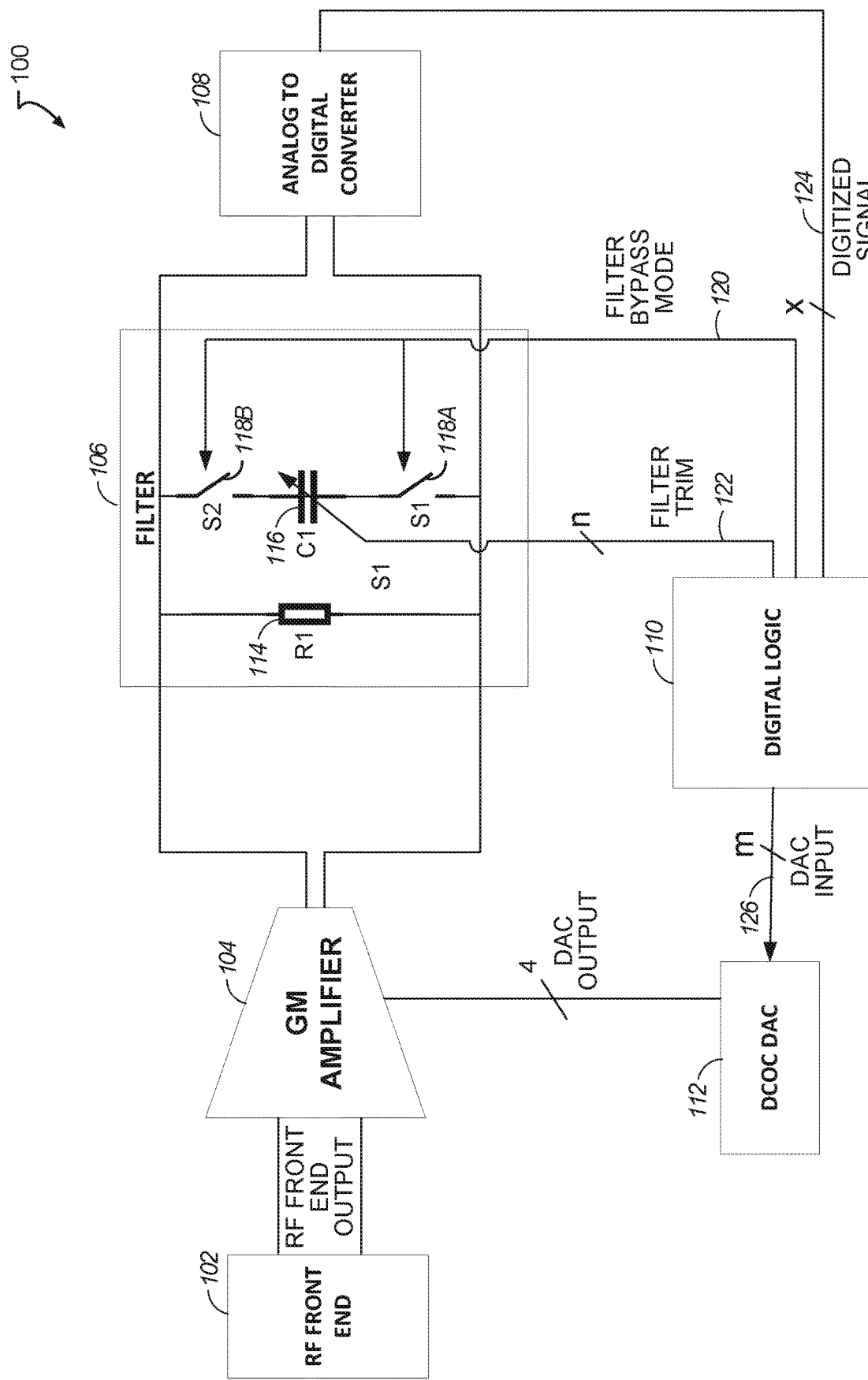
FIG. 1 illustrates, by way of example, a diagram of an embodiment of a system for tuning a baseband filter.

FIG. 1 illustrates, by way of example, a diagram of an embodiment of a system 100 for tuning a baseband filter 106. The system 100 as illustrated includes a radio frequency (RF) front end 102, an amplifier 104, the baseband filter 106, an ADC 108, digital logic 110 (sometimes called firmware), and a direct current offset correction (DCOC) digital to analog converter (DAC) 112.

Figure 11:
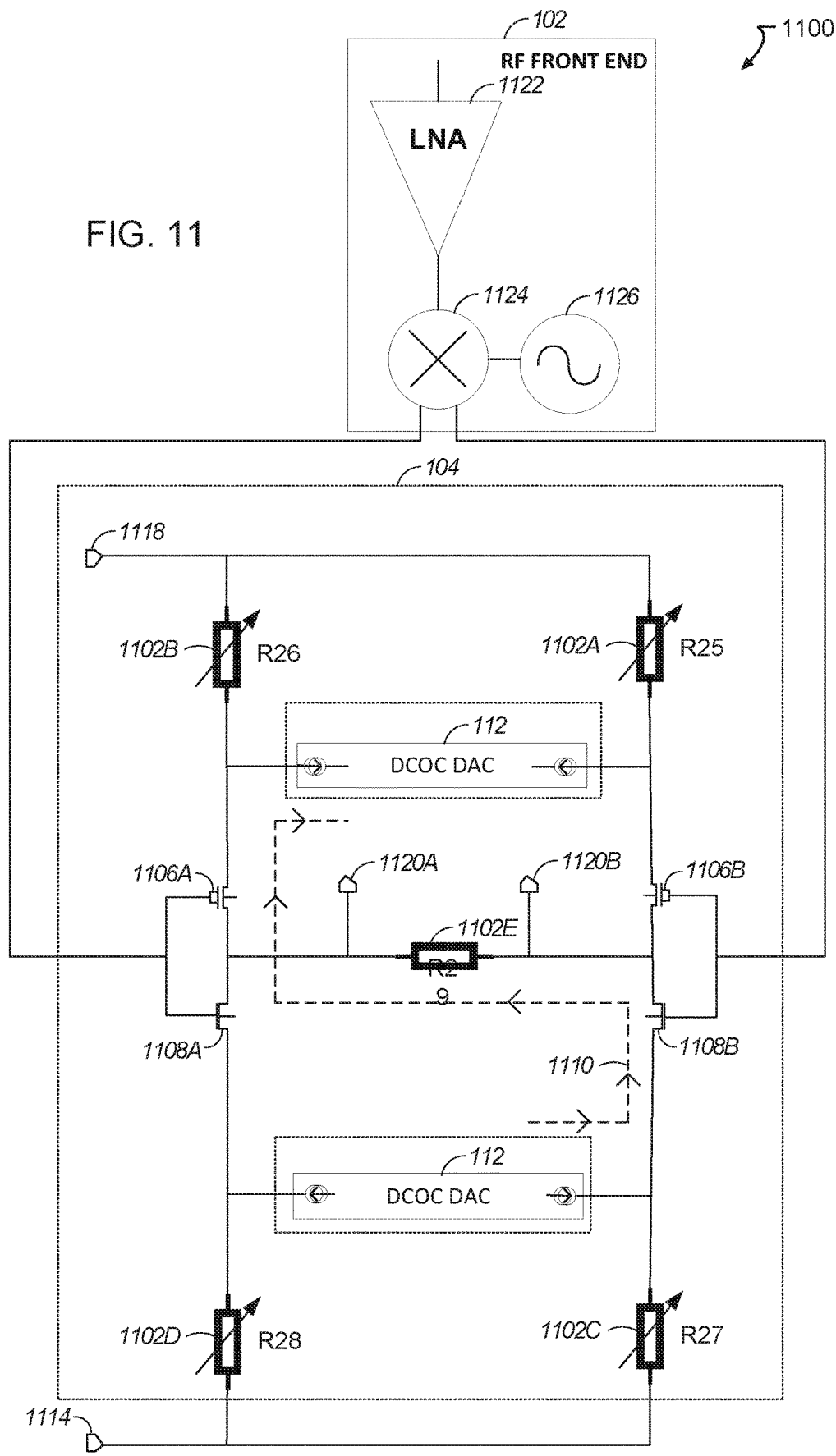
FIG. 11 illustrates, by way of example, a diagram of an embodiment of an amplifier DC offset correction system.

The RF front end 102 amplifiers and down converters the incoming signal into a baseband signal. In a radio, the RF front end 102 is the circuitry that includes all the components that process the signal at the original RF (the frequency at which signals from an antenna of the radio resonate). FIG. 11 illustrates the RF front end 102 in more detail.

The amplifier 104 is a $g_m$ amplifier. The amplifier 104 and the baseband filter 106 can help condition the down converted RF signal to a frequency within operation range of the ADC. As previously discussed, most $g_m$ amplifiers have a current mirror (an amplifying portion) and a differential portion. More details regarding an embodiment of a $g_m$ amplifier are provided regarding FIGS. 11-12, among others.

The baseband filter 106 suppresses frequencies outside of a specified range. In embodiments, the baseband filter 106 can be a lowpass filter. The baseband filter 106 as illustrated includes at least one impedance device 114 (e.g., a resistor, capacitor, inductor, or a combination thereof electrically coupled in series or parallel), at least one digitally trimmable capacitor 116, and at least one switch device 118A, 118B. The frequency response of the baseband filter 106 depends on the values of the impedance device 114 and capacitor 116 and the arrangement of the impedance device 114 and the capacitor 116 relative to one another (e.g., series or parallel electrical paths or the like). A trim of the capacitor 116 can be controlled by the digital logic 110.

The bypass switch device 118A, 118B can be implemented using one or more transistors. A state of the bypass switch device 118A, 118B can be controlled by the digital logic 110. A state of the bypass switch device 118A, 118B can include an open state, in which the capacitor 116 is not part of the electrical path between the amplifier 104 and the ADC 108. Another state of the bypass switch device 118A, 118B can include a closed state, in which the capacitor 116 is part of the electrical path between the amplifier 104 and the ADC 108.

The ADC 108 converts an analog signal to a digital word 124 based on an amplitude of the analog signal. Generally, the greater the amplitude, the greater the binary value (e.g., in two's complement or standard binary form) of the digital word 124 produced by the ADC 108.

The digital logic 110 can control the trim of the capacitor 116, the state of the switch device 118A, 118B, and an input 126 to the DCOC DAC 112. The digital logic 110 can include electronic components, such as can includes at least one AND gate, OR gate, XOR gate, negate gate, current buffer, oscillator, multiplexer, resistor, transistor, capacitor, inductor, relay, or the like. Operations of the digital logic 110 are described in more detail regarding FIG. 2 and elsewhere herein.

The DCOC DAC 112 can perform offset correction. The DCOC DAC can convert a digital word on the input 126 to an analog signal (the reverse operation of the ADC). The DCOC DAC 112 can receive a digital word from the digital logic 110 and feedback from the amplifier 104 as an input. The DCOC DAC 112 produces four outputs 128 based on the digital word and the feedback. More details regarding the DCOC DAC 112 are provided regarding FIGS. 11-13, among others.

Figure 2:
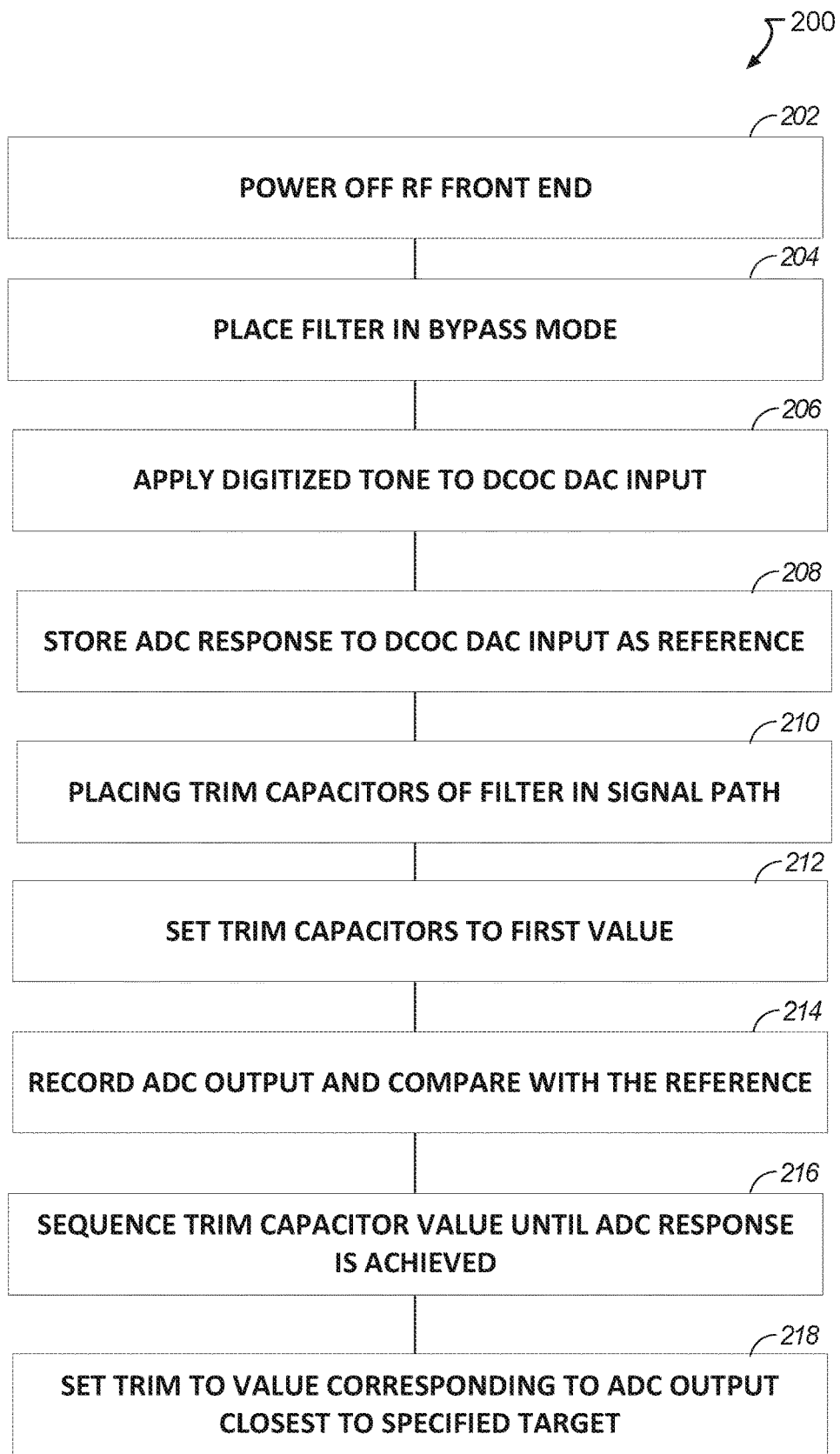
FIG. 2 illustrates, by way of example, an embodiment of a method 200 for trimming a baseband filter, such as the baseband filter 106.

FIG. 2 illustrates, by way of example, an embodiment of a method 200 for trimming a baseband filter, such as the baseband filter 106. The method 200 can be performed using the system 100 or components coupled thereto. The method 200 can be performed automatically, such as without human interference after deployment. The method 200 as illustrated includes powering off the RF front end 102, at operation 202; placing the filter 106 in bypass mode, at operation 204; applying a digitized tone to input of the DCOC DAC 112 (e.g., by the digital logic 110), at operation 206; storing a response of the analog to digital converter (ADC) 108 to the digitized tone, at operation 208; placing the trim capacitor 116 in the signal path, at operation 210; setting the trim capacitors to a first value, at operation 212; recording ADC output and comparing with the reference, at operation 214; sequencing the trim capacitor 116 to determine response to digitized tone at each trim capacitor value, at operation 216; and setting trim value of the capacitor 116 to value corresponding to output of the ADC 108 closest to a specified target, at operation 218.

The operation 202 can include opening a switch device (e.g., configuring a transistor to refrain from passing current, such as by controlling a gate voltage) that, when closed, electrically couples a power source to the RF front end. The operation 204 can include opening the switch device 118A, 118B. Opening the switch devices 118A, 118B can include controlling current conducted through a transistor such that the transistor does not conduct current. Opening the switch devices 118A 118B can provide a path, in series with the capacitor 116, that has near infinite impedance, thus bypassing the capacitor 116.

The digitized tone, at operation 206 can include a digitized tone at a specified frequency. The operation 210 can include closing the switch devices 118A, 118B, such as by controlling a gate voltage of a transistor of the switch devices 118A, 118B so that the transistor conducts current therethrough. The operation 214 can include setting the filter trim 122 to a series of values 0, 1, . . . , $2^{n-1}$ in turn (or a subset thereof), where n is the number of lines driving the value of the trim capacitor 116. The response to the digitized tone for each of the values can be recorded in a memory.

FIG. 3 illustrates, by way of example, an embodiment of a lookup table (LUT) 300. The value of the capacitor from a calibration, as performed by the method 200, can be recorded. The LUT 300 can be configured such that the calibration value determined by the method 200 can be used to determine a trim value for other frequencies (other than the digitized tone frequency). The LUT 300 as illustrated includes a bandwidth 302, a mode 304 associated with the bandwidth 302 in the same row, and RC variations 306 associated with the mode 304 and bandwidth 302 in the same row. The bandwidth 302 can be organized in ascending or descending order up or down the column. The bandwidth 302 can specify the bandwidth of the system 100 using the mode 304. The mode 304 can detail the operation specification associated with the bandwidth 302. For example, the mode 304 can include a variety of long term evolution (LTE) operations modes, such as second generation (2G), third generation (3G), fourth generation (4G), fifth generation (5G), LTE 1.4, LTE 3, LTE 5, LTE 10, LTE 15, LTE 20, LTE 30, LTE 40, LTE 60, LTE 80, or LTE 100, of a transmission scheme, such as code division multiple access (CDMA), time division multiple access (TDMA), frequency division multiple access (FDMA), synchronous code division multiple access (SCDMA), or a combination thereof, among others. The RC variation 306 details the response the of the ADC 108 to the digitized tone applied to the DCOC DAC 112.

To determine the trim value to use in operating the capacitor 116 for a specific mode, the LUT 300 can be used as follows. Calibrate the trim value of the capacitor 116 using one of the modes 304. Lookup the value output by the ADC 108 in the row corresponding to the mode. Then, "move up/down" the column to determine the value to which to trim the capacitor 116 in different modes. For example, assume that the filter 106 is calibrated in mode, $Y_4$, and that the value obtained for the RC variation is "56". If the system 100 is to be operated in mode $Y_9$, the LUT 300 indicates that the capacitor 116 is to be trimmed to value "104" mode 304. Follow the column in which the RC variation for mode $Y_4$ equals "56" down to mode $Y_9$, to get "104". These operations can be automated and performed by the digital logic 110.

Consider an example which a 10 MHz filter corner is desired, and the digitized tone frequency is 10 MHz. A −3 dB trim target can be established. Note that the tone does not have to be at the same frequency as the filter corner. The tone can be placed such that an arbitrary magnitude difference, within reason, can be measured with respect to a reference magnitude. Note that clocking frequencies of the digital logic and the filter specifications are among the variables that impact the tone frequency and target magnitude. Further note that any order filter can be trimmed with the method 200.

Gain Control and Filter

One solution to providing gam control for an amplifier includes varying a feedback resistance of an inverting operational amplifier. The varied feedback resistance alters the amplifier gain. Another solution to providing gain control can include introducing a programmable standalone gain stage, without filtering, to vary the system gain. Yet another solution can include changing an input resistance of an inverting operational amplifier and leaving a feedback impedance device unmodified.

Varying a feedback resistance of a low pass filter (LPF) inverting opamp changes the filter response since a frequency pole varies directly with the resistance. This wandering pole phenomenon can be overcome by trading off capacitor values as the resistance is varied. This solution is complex and inefficient given that these networks are trimmed and stepped logarithmically. Changing the input resistance to vary the gain of an inverting operational amplifier varies the input referred noise (noise gain) performance of the operational amplifier. Having a dedicated standalone gain stage for an AGC solution consumes more area and increases current drain.

Embodiments of AGC circuitry herein can maintain a constant filter response over all programmable AGC states in a single receiver stage. The embodiments allow gain control and precision filtering to take place in one stage since the input impedance of the AGC network is constant and independent of the AGC settings.

Embodiments can include a unique impedance device ladder structure. The structure can provide the AGC steps required by a receiver system to handle large signals incident thereon. The impedance device network can include a constant input impedance, independent of the AGC settings, which combined with a capacitor creates a fixed low pass filter response needed in a receiver system.

Embodiments can provide an efficient filter and AGC solution in terms of reduced power, complexity, or die area consumed as compared to previous solutions. AGC and filtering can take place in one stage with the filter 3 dB corner, gain, and input referred noise remaining independent of each other.

Figure 4:
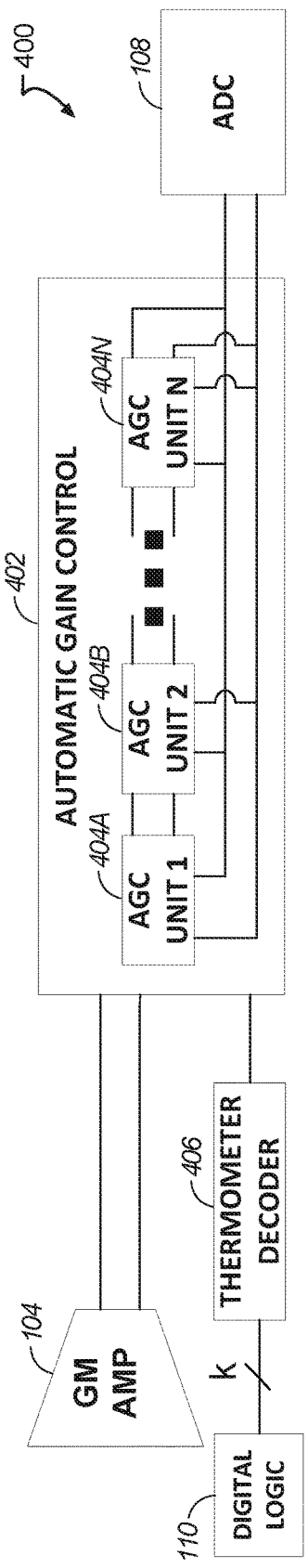
FIG. 4 illustrates, by way of example, a diagram of an embodiment of an AGC system.

FIG. 4 illustrates, by way of example, a diagram of an embodiment of an AGC system 400. The AGC system 400 as illustrated includes the $g_m$ amplifier 104, the digital logic 110, the ADC 108, automatic gain control (AGC) circuitry 402, and a thermometer decoder 406. T The AGC circuitry 402 is electrically coupled between the $g_m$ amplifier 104 and the ADC 108. The AGC circuitry 402 receives, as input, the output of the $g_m$ amplifier 104 and the thermometer decoder 406. The AGC circuitry 402 includes at least one AGC unit 404A, 404B, or 404N. Each AGC unit 404A-404N can include circuitry configured with similar components electrically connected similarly. Each AGC unit 404A-404N, when in a signal path, reduces a gain of a signal from the $g_m$ amplifier 104 a specified amount AGC units are illustrated in more detail in FIG. 5.

The thermometer decoder 406 receives kbits from the digital logic 110 indicating how many of the AGC units 404A-404N are to be in the signal path. The thermometer decoder 406 produces an l-bit output that includes a bit for each of the AGC units. If there are N AGC units 404A-404N, then l=N. An example of a thermometer decoder output for a thermometer decoder that receives a three-bit input to drive five AGC units is provided in Table 1.

TABLE 1

| DIGITAL LOGIC CONTROL VALUE | THERMOMETER DECODER VALUE |
| --- | --- |
| 000 | 00000 |
| 001 | 00001 |
| 010 | 00011 |
| 011 | 00111 |
| 100 | 01111 |
| 101 | 11111 |
| 110 | 11111 |
| 111 | 11111 |

The thermometer decoder 406 produces, as output, a value that includes a number of ones (or zeros in reverse logic) equal to the value at the input up to the maximum number of bits at the output. Thus, if the value of the input from the digital logic 110 is two (e.g., "010") the number of ones (or zeros) at the output of the thermometer decoder 406 can be "00011" (two ones). This output of the thermometer decoder 406 can then be used to drive at least one switch device of the AGC unit 404A-404N and configure the AGC unit 404A-404N into or out of a signal path of the output of the $g_m$ amplifier 104.

Figure 5:
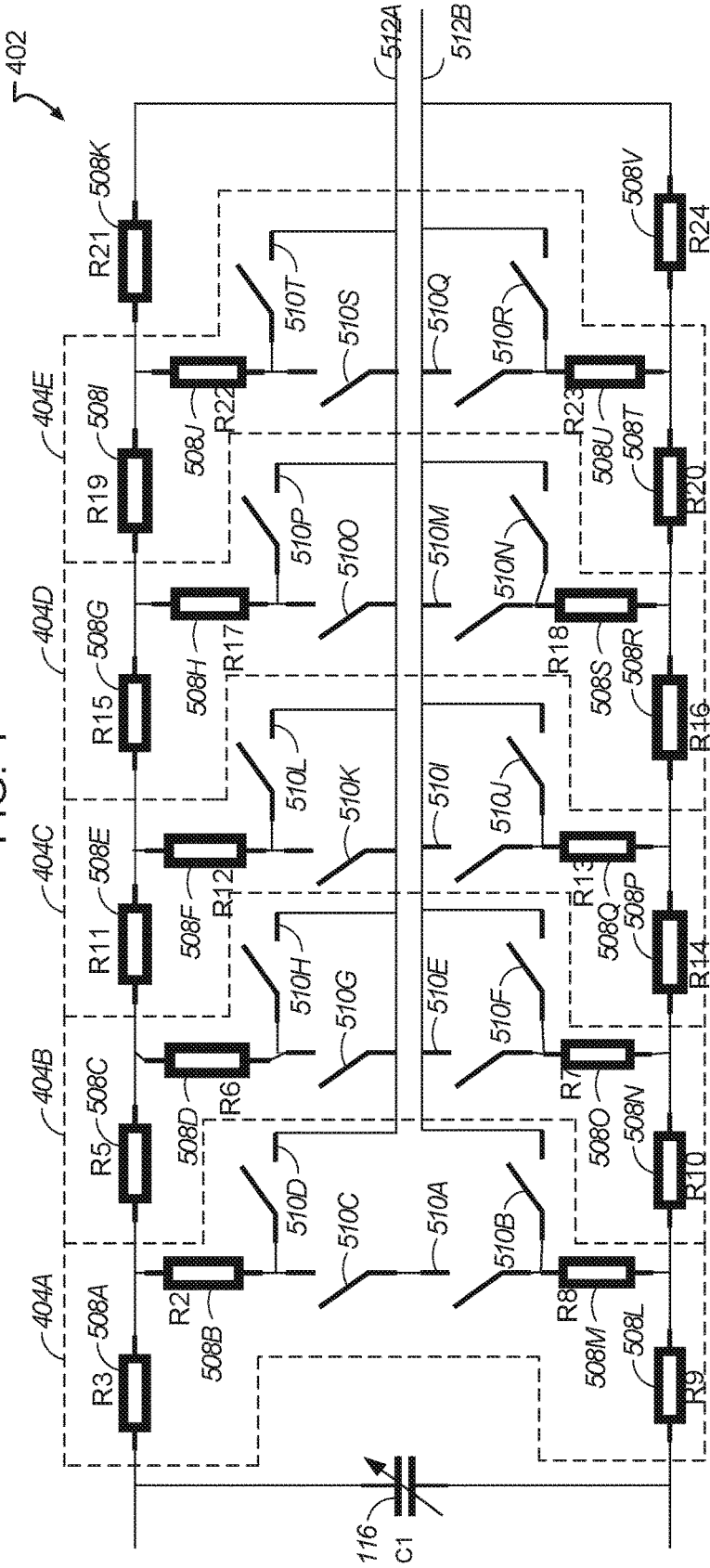
FIG. 5 illustrates, by way of example, a diagram of an embodiment of the AGC circuitry in which N=5 such that there are five AGC units.

FIG. 5 illustrates, by way of example, a diagram of an embodiment of the AGC circuitry 402 in which N=5 such that there are five AGC units 404A-404E. Each AGC unit 404A-404E includes four impedance devices and four switch devices.

The AGC unit 404A includes a first impedance device 508A, a second impedance device 508B, a third impedance device 508L, and a fourth impedance device 508M and a first switch device 510A, a second switch device 510B, a third switch device 510C, and a fourth switch device 510D. The switch devices 510A and 510C are electrically coupled such that, when they are closed, the impedance devices 508B and 508M are electrically in series. The switch devices 510A and 510C are electrically coupled such that, when one of them is open, the impedance devices 508B and 508M are electrically isolated from each other. The switch devices 510B and 510D are electrically coupled such that, when they are closed, the impedance devices 508B and 508B are electrically in parallel. The switch devices 510B and 510D are electrically coupled such that, when they are open, the impedance devices 508B and 508M are electrically isolated from an output 512A, 512B of the AGC unit 404A.

The values of the impedance devices of each of the AGC units 404A-404E can be such that the impedance devices 508A, 508C, 508E, 508G, 508I, 508L, 508N, 508P, 508R, and 508T have the same value (within the tolerance limit of the impedance device), the impedance devices 508B, 508D, 508F, 508H, 508J, 508M, 508O, 508Q, 508S, and 508U have the same value (within the tolerance limit of the impedance device), and the impedance devices 508K and 508V have the same vale (within the tolerance limit of the impedance device). In some embodiments, if the impedance value of the impedance devices 508K and 508V is R, the 508A, 508C, 508E, 508G, 508I, 508L, 508N, 508P, 508R, and 508T can have an impedance value of R/4 and the impedance devices 508B, 508D, 508F, 508H, 508J, 508M, 508O, 508Q, 508S, and 508U can have the impedance value 3R (the R/4 and R3 relationship is merely an example and was chosen such that all the resistors are integer related for better matching for a 2.5 dB AGC step). In this way, the impedance of the AGC circuitry 402 can remain constant regardless of how many of the AGC units 404A-404E are in the signal path of the signal from the $g_m$ amplifier 104.

Figure 6:
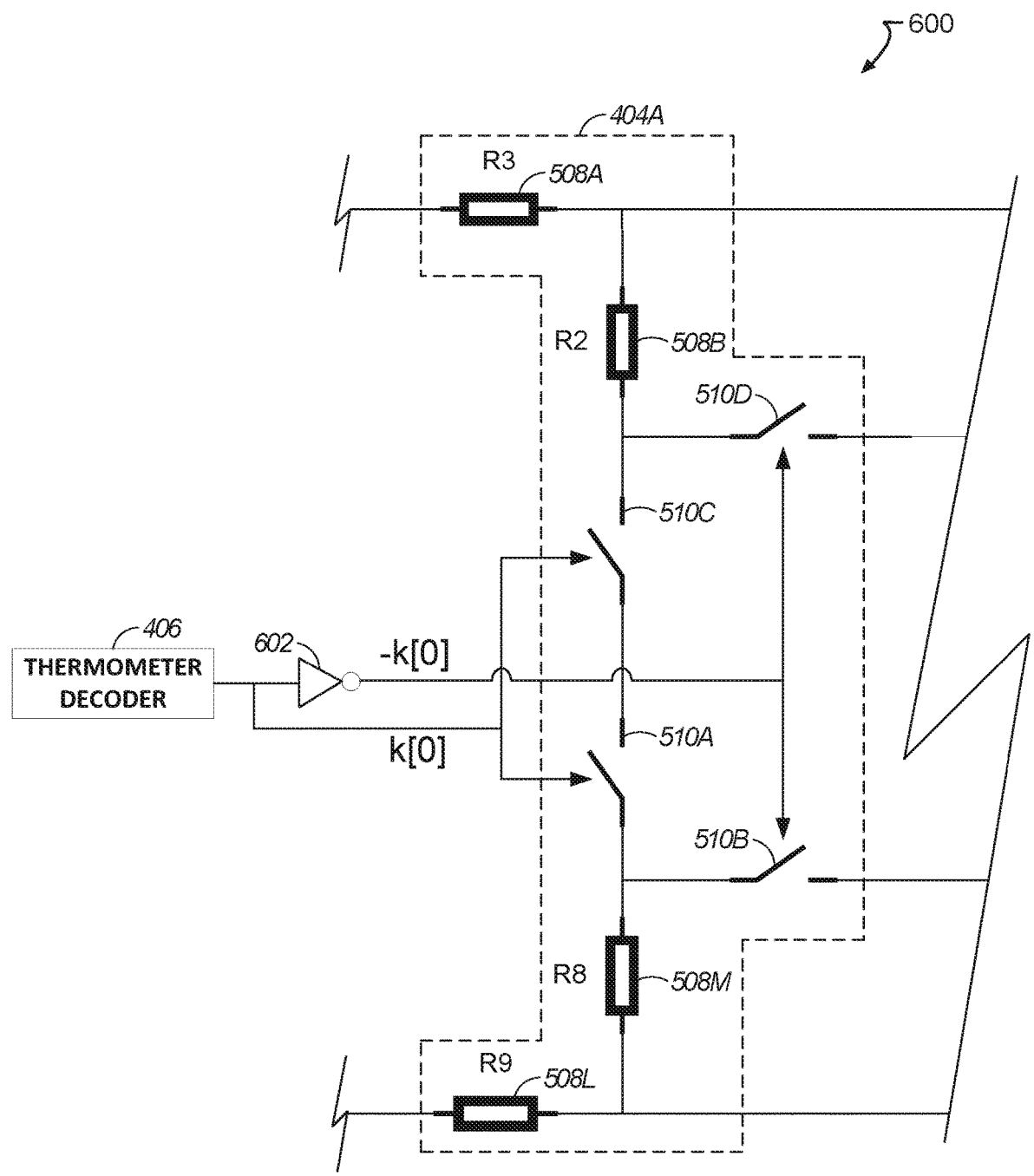
FIG. 6 illustrates, by way of example, a diagram of an embodiment of a portion of the system.

FIG. 6 illustrates, by way of example, a diagram of an embodiment of a portion of the system 400. The portion illustrated in FIG. 6 includes the AGC unit 404A, the thermometer decoder 406 and a negate gate 602. The thermometer decoder 406, as previously discussed, controls the state of the AGC units 404A-404E. More specifically, the thermometer decoder 406 controls a state of the switch devices of the AGC units, such as switch devices 510A, 510B, 510C, 510D, 510E, 510F, 510G, 510H, 510I, 510J, 510K, 510L, 510M, 510N, 510O, 510P, 510Q, 510R, 510S, and 510T. The state of the switch devices can include open (e.g., non-conducting) and closed (e.g., conducting). Each of the bits produced by the thermometer decoder 406 can be used individually to control respective states AGC units 404A-404E.

Consider the portion of the system 600 illustrated in FIG. 6. The thermometer decoder 406 produces five bits, k[0:4]. Each of the bits can be provided in negated and non-negated form to control the switch devices of the corresponding AGC unit 404. For example, the least significant bit (LSB) of k can be used to control the state of the switch devices 510A-510D of the AGC unit 404A, the second LSB of k ([1]) can be used to control the state of the switch devices 510E-510H, and so on.

The negate gate 602 can produce a negated version (e.g., "0" if input is "1" or "1" if input is "0"). The raw (non-negated) output of the thermometer decoder 406 can be used to drive the switch devices 510A and 510C and the negated version from the negate gate 602 can be used to drive the switch devices 510B and 510D, or vice versa. The switch devices 510A and 510C are driven by the same signal and the switch devices 510B and 510D are driven by a complement of that signal. Thus, the switch devices 510A and 510C are in an opposite state as the switch devices 510B and 510D. That is, when the switch devices 510A and 510C are open, the switch devices 510B and 510D are closed and when the switch devices 510A and 510C are closed, the switch devices 510B and 510D are open. When, the switch devices 510D and 510B are closed, AGC units 404B-404 downstream of the AGC unit 404A are bypassed. When the switch devices 510D and 510B are open, the AGC unit 404B immediately downstream from the AGC unit 404A is in the signal path.

The AGC circuitry 402 can perform a dual role. The AGC circuitry 402 is a low pass filter (LPF) with the capacitor 116 and the impedance devices of the AGC circuitry 402 in the signal path defining the frequencies that are passed therethrough. The AGC circuitry 402 also provides gain control for signals incident thereon. For example, for each of the AGC units 404A-404E that are switched into the signal path, the gain can be reduced by a specified amount (e.g., 0 dB, 2.5 dB, 5 dB, etc., or some amount in between).

The AGC circuitry 402 is electrically coupled between the output of the $g_m$ amplifier 104 and the input of the ADC 108. The AGC circuitry 402 is a differential circuit. The AGC circuitry 402 includes AGC units 404A-404E that provide a 0.0 dB, 2.5 dB, 5.0 dB, 7.5 dB, 10.0 dB, 12.5 dB, etc. of attenuation or other attenuation greater than, lesser than, or therebetween, each in the embodiment illustrated. The level of attenuation can be chosen so there is an integer relationship between all the impedance device values for best matching. Any level of attenuation is achievable by modifying the impedance device ratios and/or the number of AGC units 404.

Figure 7:
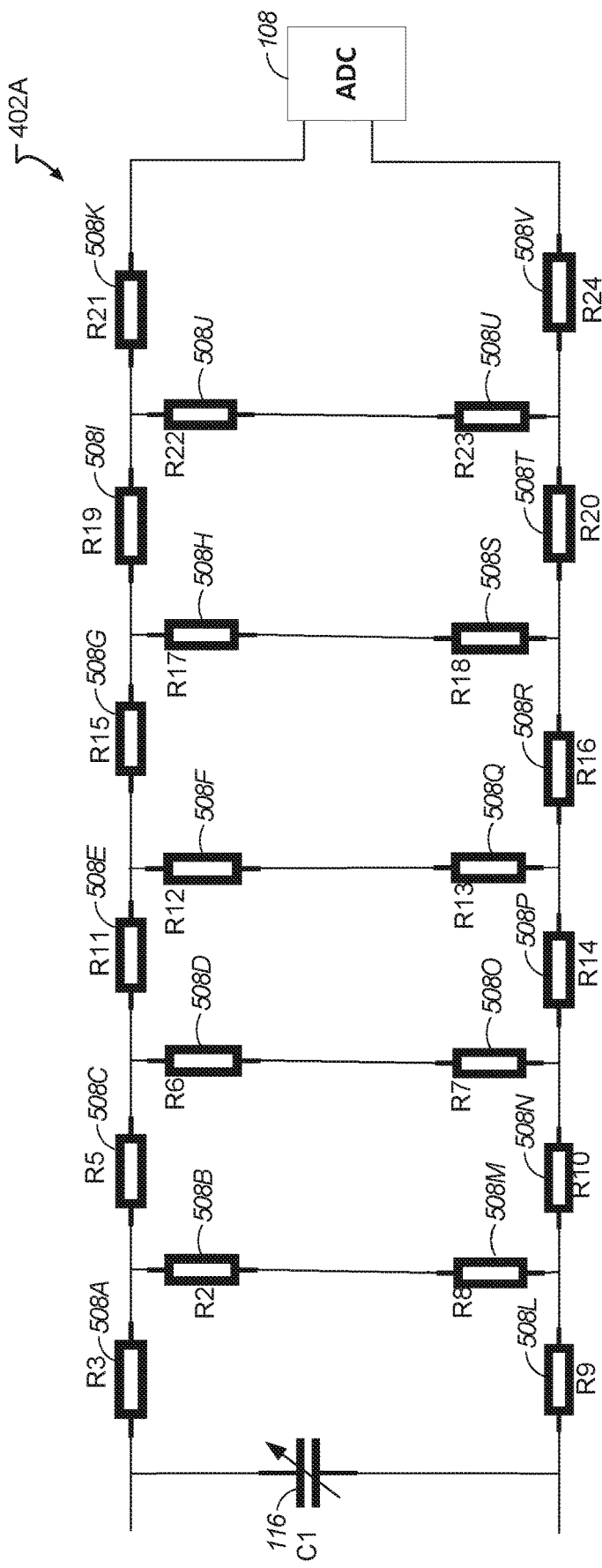
FIG. 7 illustrates, by way of example, a diagram of an embodiment of the AGC circuitry configured for the highest level of attenuation, lowest system gain, allowing only a portion of the signal current to reach the input of the ADC.

FIG. 7 illustrates, by way of example, a diagram of an embodiment of the AGC circuitry 402A configured for the highest level of attenuation, lowest system gain. To achieve the highest level of attenuation, lowest system gain, the switch devices 510A, 510C, 510E, 510G, 510I, 510K, 510M, 510O, 510Q, and 510S are closed and the switch devices 510B, 510D, 510F, 510H, 510J, 510L, 510N, 510P, 510R, and 510T are open. This allows a portion of the signal current to bypass the input of the ADC 108. The remaining signal than flows to the input of the ADC 108. The AGC circuitry 402A acts like a current divider when in this configuration, allowing only a portion of the signal current to reach the input of the ADC 108.

Figure 8:
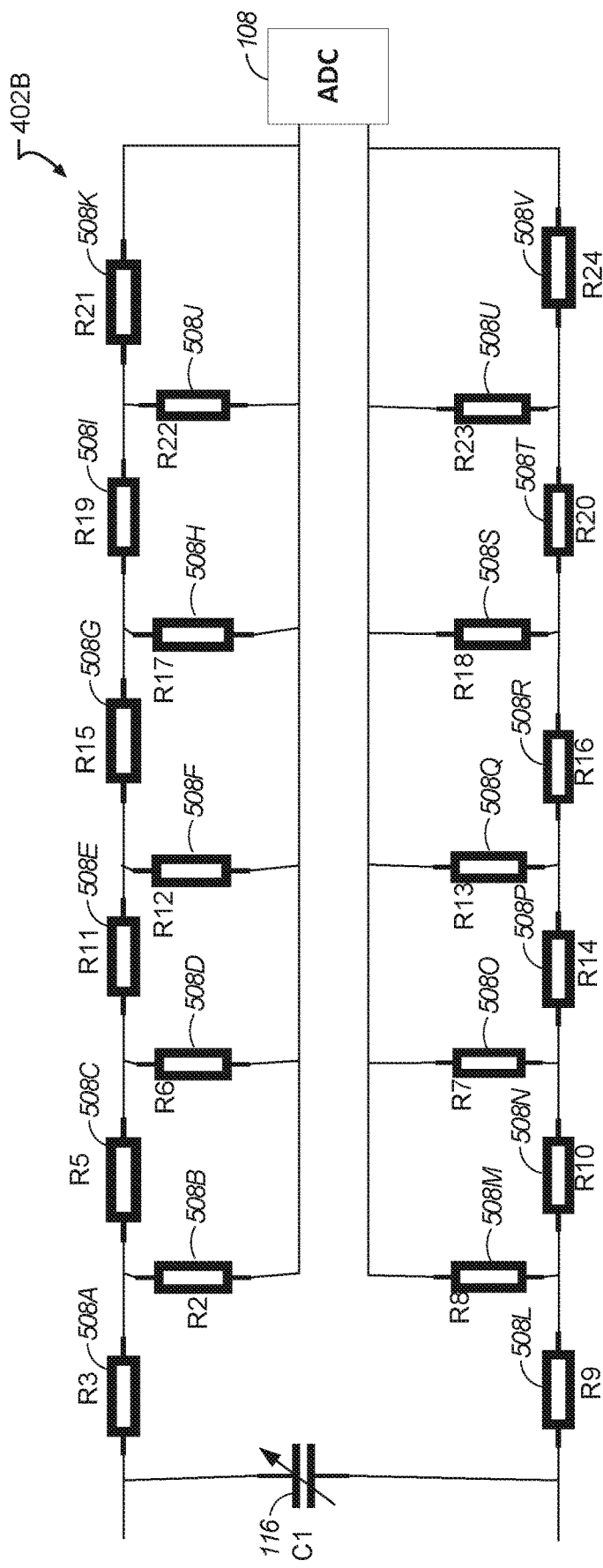
FIG. 8 illustrates, by way of example, a diagram of an embodiment of the AGC circuitry configured for a lowest level of attenuation, highest system gain.

FIG. 8 illustrates, by way of example, a diagram of an embodiment of the AGC circuitry 402B configured for a lowest level of attenuation, highest system gain. To achieve the lowest level of attenuation, highest system gain, the switch devices 510A, 510O, 510E, 510G, 510I, 510K, 510M, 510O, 510Q, and 510S are open and the switch devices 510B, 510D, 510F, 510H, 510J, 510L, 510N, 510P, 510R, and 510T are closed. This provides an attenuation of zero as all the signal current flows to the input of the ADC 108 regardless of where the signal current is in the AGC circuitry 402B. That is, all legs in the AGC circuitry 402A are switched to the input of the ADC 108.

Figure 9:
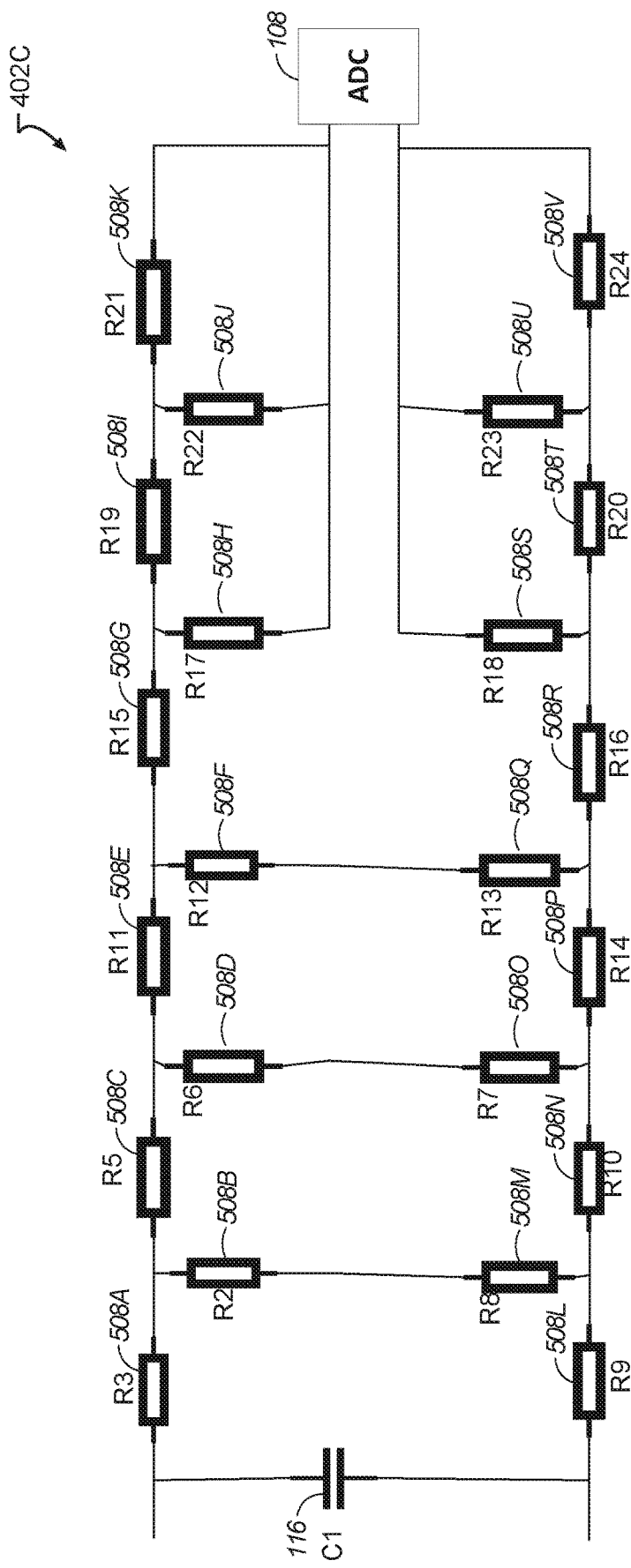
FIG. 9 illustrates, by way of example, a diagram of an embodiment of the AGC circuitry configured for a level of attenuation, system gain, between those achieved by the AGC circuitry.

FIG. 9 illustrates, by way of example, a diagram of an embodiment of the AGC circuitry 402C configured for a level of attenuation, system gain, between those achieved by the AGC circuitry 402A and 402B. To achieve the intermediate level of attenuation, intermediate system gain, some of the switch devices 510A-510T are open and some of the switch devices 510A-510T are closed. This provides an attenuation of between zero and the maximum attenuation of the AGC circuitry 402.

The FIGS. 7-9 have the respective switch devices 510A-510T removed (if they are open) or replaced with wires (if they are closed). In the AGC circuitry 402 the analog ground of the ADC 108, connections 512A and 512B, behaves the same as a common mode connection between the two series impedance devices in each of the parallel legs of the AGC circuitry 402, thus rendering the same input resistance ($g_m$ amplifier load resistance) for each attenuation achievable by the AGC circuitry 402.

As discussed previously, the thermometer decoder 406 can control the switch devices of the AGC circuitry 402 and ultimately the attenuation achieved by the AGC circuitry 402. Referring to FIG. 5, the AGC units 404A-404E can be controlled left to right to realize 0 dB to 12.5 dB attenuation in 2.5 dB steps, for example and respectively. As each AGC unit 404A-404E becomes enabled (e.g., the switch devices 510A, 510C, 510E, 510G, 510I, 510K, 510M, 510O, 510Q, and 510S of the corresponding AGC unit are open and the switch devices 510B, 510D, 510F, 510H, 510J, 510L, 510N, 510P, 510R, and 510T of the corresponding AGC unit are closed), the enable can remain set as the next stage is activated for a higher level of attenuation, hence the thermometer decoding.

In addition to providing gain programmability, the AGC impedance device network has a constant input resistance equal to about R*2 regardless of the AGC settings. This is an attribute that allows a low pass filter (LPF) to be constructed by placing the capacitor 116 in the AGC circuitry 402 as shown. The filter corner of the LPF is corner frequency=1/(R*2*C*PI).

Figure 10:
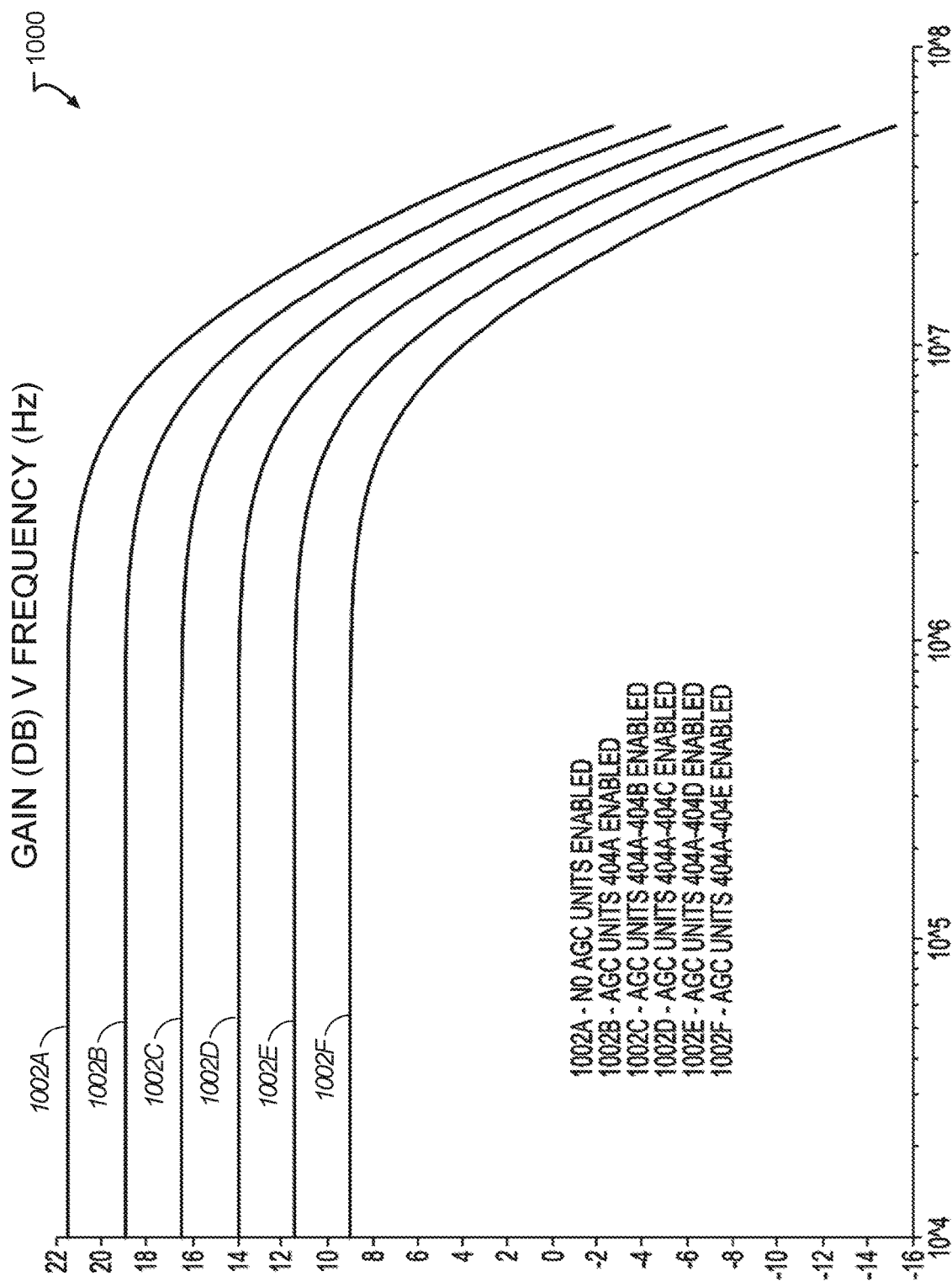
FIG. 10 illustrates, by way of example, an embodiment of a graph that illustrates the filter frequency response with the AGC circuitry varied through each of six attenuation levels.

FIG. 10 illustrates, by way of example, an embodiment of a graph 1000 that illustrates the filter frequency response with the AGC circuitry varied through each of six attenuation levels. Zero attenuation is represented by line 1002A (e.g., 0 AGC units 404A-404E in the signal path). Attenuation corresponding to 1 AGC unit 404A in the signal path is represented by line 1002B. Attenuation corresponding to 2 AGC units 404A-404B in the signal path is represented by line 1002C. Attenuation corresponding to 3 AGC units 404A-404C in the signal path is represented by line 1002D. Attenuation corresponding to only 4 AGC units 404A-404D in the signal path is represented by line 1002E. Attenuation corresponding to only 5 AGC units 404A-404E in the signal path is represented by line 1002F.

Table 2 summarizes some information from the graph 1000. The Table 2 lists the filter 106 3 db bandwidth frequency, absolute gain in dB, and input referred noise in v/rtHz as a function of the AGC digital control signal. The filter 3 dB corner and input noise remain generally constant as the AGC/gain is varied. This means that the load as seen by the $g_m$ amplifier 104 remains constant.

TABLE 2

| AGC Control Signal | 3 dB Frequency | Gain (dB) | Noise (v/rtHz) |
| --- | --- | --- | --- |
| 0 | 7.006E6 | 21.47 | 3.817E-9 |
| 1 | 7.001E6 | 18.97 | 3.774E-9 |
| 2 | 6.997E6 | 16.46 | 3.749E-9 |
| 3 | 6.996E6 | 13.95 | 3.735E-9 |
| 4 | 6.995E6 | 11.44 | 3.727E-9 |
| 5 | 6.994E6 | 8.934 | 3.722E-9 |

Embodiments of the AGC systems discussed provide a low cost, low power, or low die area solution to providing AGC and filter capability in one circuit. Embodiments combine AGC and filtering into one stage with both features behaving independently. Furthermore, embodiments demonstrate constant input referred noise over AGC control as well. The filter capacitor 116 can be trimmed (e.g., using the method 200) for both process and mode without regard for the AGC setting, simplifying firmware (e.g., the digital logic 110) implementation.

DCOC DAC

A $g_m$ amplifier 104 electrically coupled to a mixer of an RF front end suffers from varying DC offsets. One solution to compensating for the varying offset is to apply a correction to an input to the $g_m$ amplifier 104. The input can be from the mixer of the RF front end. This solution, however, consumes a prohibitive amount of die space and current.

A solution of embodiments consumes less die area or current than previous input correction techniques. Embodiments can include a DCOC DAC with four current outputs. The DCOC DAC outputs can be connected to the sources of the $g_m$ amplifier transistors. The sources of the $g_m$ amplifier transistors can be degenerated and isolate the DC offset correction, from the DC coupled Mixer, on the $g_m$ amplifier transistor gates. The polarity and magnitude of each DCOC DAC output can be such that the DC offset correction is realized across the resistive load connected across the drains of the $g_m$ amplifier transistors.

As previously discussed, embodiments herein realize DCOC in a DC coupled receiver using less current drain or die area. Previous solutions that apply DC offset to the $g_m$ amplifier inputs require more current and die area to maintain the same specifications. DCOC can be important in maintaining a receive dynamic range and intermodulation product performance of a mixer.

FIG. 11 illustrates, by way of example, a diagram of an embodiment of an amplifier offset correction system 1100. The system 1100 as illustrated includes the RF front end 102, the DCOC DAC 112, and circuitry of the $g_m$ amplifier 104. The system 1100 can compensate for a DC offset voltage or current.

The RF front end 102, as illustrated, includes a linear amplifier 1122, an oscillator 1126, and a mixer 1124. The linear amplifier 1122 includes circuitry that produces an output proportional to an input and can provide increased power to a load. The oscillator 1126 includes circuitry that produces a periodic, oscillating electronic signal, often a sine wave or a square wave. Oscillators generally convert a DC signal to an AC signal. The mixer 1124 includes circuitry that creates an output signal using a signal from the oscillator 1126 and the linear amplifier 1122 as input. The mixer 1124 modulates data from the linear amplifier 1122 onto the signal from the oscillator 1126. The frequency of the oscillator 1126 can be less than an operating frequency of an antenna couple to the RF front end 102, such as to shift signals from the antenna to an intermediate frequency.

The $g_m$ amplifier 104 can include the circuitry of FIG. 11 except the RF front end 102 and the DCOC DAC 112. The $g_m$ amplifier 104 illustrated is a dual path degenerated inverter based amplifier with common mode feedback (CMFB not shown). The degeneration can be provided by variable (e.g., programmable) source impedance devices 1102A, 1102B, 1102C, and 1102D. The values of the impedance devices 1102A-1102D can be adjusted to adjust the gain of the $g_m$ amplifier 104.

The $g_m$ amplifier 104 as illustrated further includes transistor pairs 1106A and 1108A, and 1106E and 1008B. A first end of the variable impedance device 1102A is coupled to a source of the transistor 1106B. A first end of the variable impedance device 1102B is electrically coupled to a source of the transistor 1106A. A first end of the variable impedance device 1102C is electrically coupled to a source of the transistor 1108B. A first end of the variable impedance device 1102D is electrically coupled to a source of the transistor 1108A.

A second end of each of the impedance devices 1102A and 1102B is electrically coupled to a power input 1118. A second end of each of the impedance devices 1102C and 1102D is electrically coupled to a ground input 1114. The variable impedance devices 1102A-1102D are optional and help linearize the $g_m$ amplifier 104 and create an amplifier gain that is less dependent on characteristics of the transistors 1106A, 1106B, 1108A, and 1108B.

The impedance device 1102E represents a load to be driven by the $g_m$ amplifier 104. Outputs 1120A, 1120B are taken across the impedance device 1102E and from the drains of the transistors 1106A, 1106B, 1108A, and 1108B.

To realize the DCOC correction in the $g_m$ amplifier 104, with a DC coupled mixer 1124 on the input, the DCOC DAC 112 is coupled with two complimentary source/sink output pairs. The DCOC DAC 112 operates to achieve positive or negative DC offset correction as shown in following figures.

The DCOC DAC 112 has two source outputs and two sink outputs which operate in a complementary fashion. FIG. 11 illustrates a positive DC offset correction across the load (represented by impedance device 1102E) present at the $g_m$ amplifier output 1120A-1120B. In FIG. 11 a current path is represented by line 1110. The DCOC DAC 112 sources current into the $g_m$ amplifier 104 p-side NMOS device source (the transistor 1108B) and sinks an equal current out of the n-side PMOS device source (the transistor 1106A). Under this condition, the DAC current is forced through the load as shown creating a positive DC offset voltage. The current magnitude and polarity is determined by the programmed DAC word (see FIG. 13).

Figure 12:
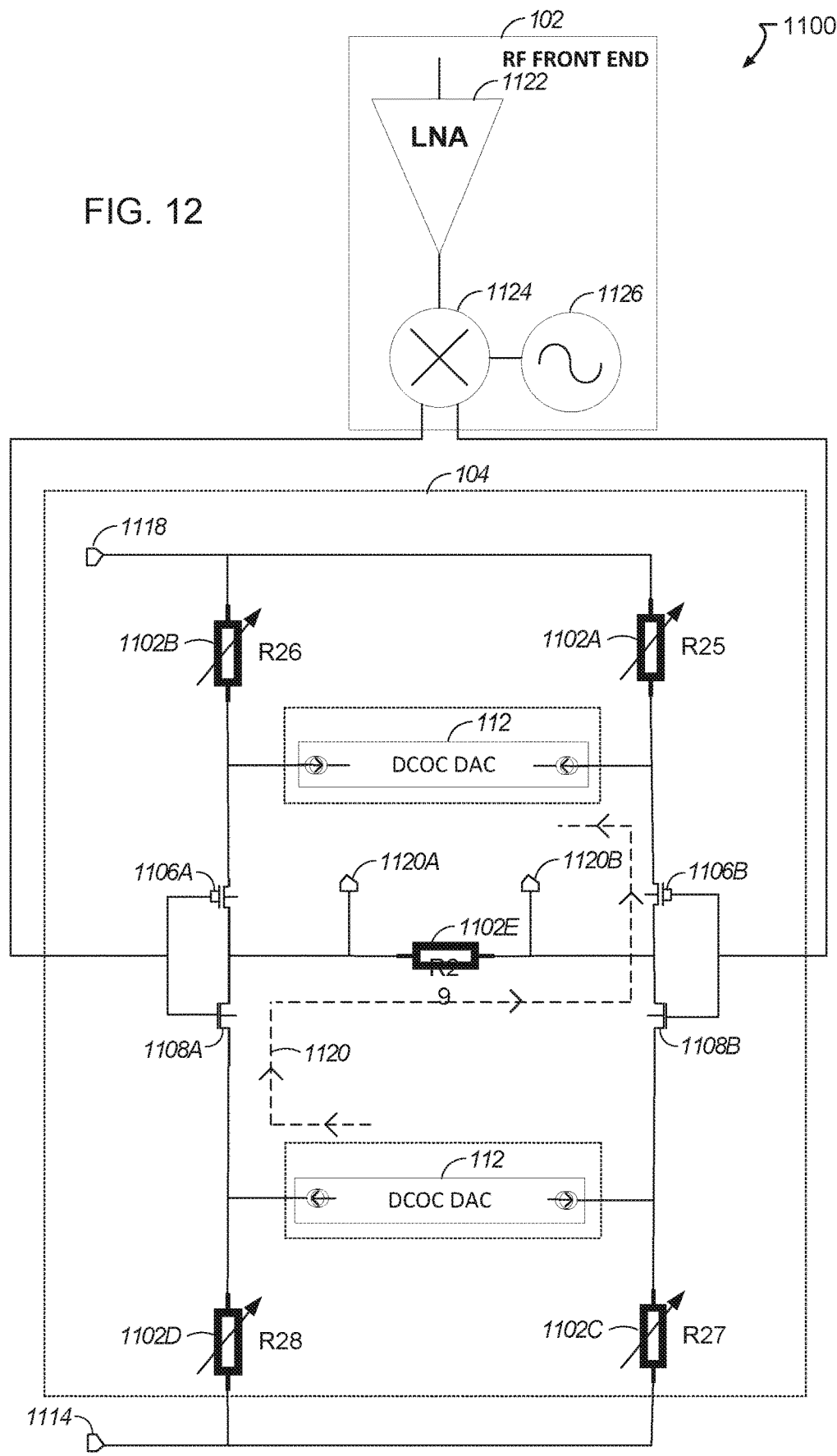
FIG. 12 illustrates, by way of example, a diagram of an embodiment of the system, but with a different DC current path represented by line.

FIG. 12 illustrates, by way of example, a diagram of an embodiment of the system 1100, but with a different current path represented by line 1210. The DCOC DAC 112 sources current into the n-side NMOS device source (the transistor 1108A) and sinks an equal current out of the p-side PMOS device source (the transistor 1106B). Under this condition, the DAC current is forced through the load impedance device 1102E as shown creating a negative DC offset voltage. The current magnitude and polarity is determined by the programmed DAC word (see FIG. 13).

Figure 13:
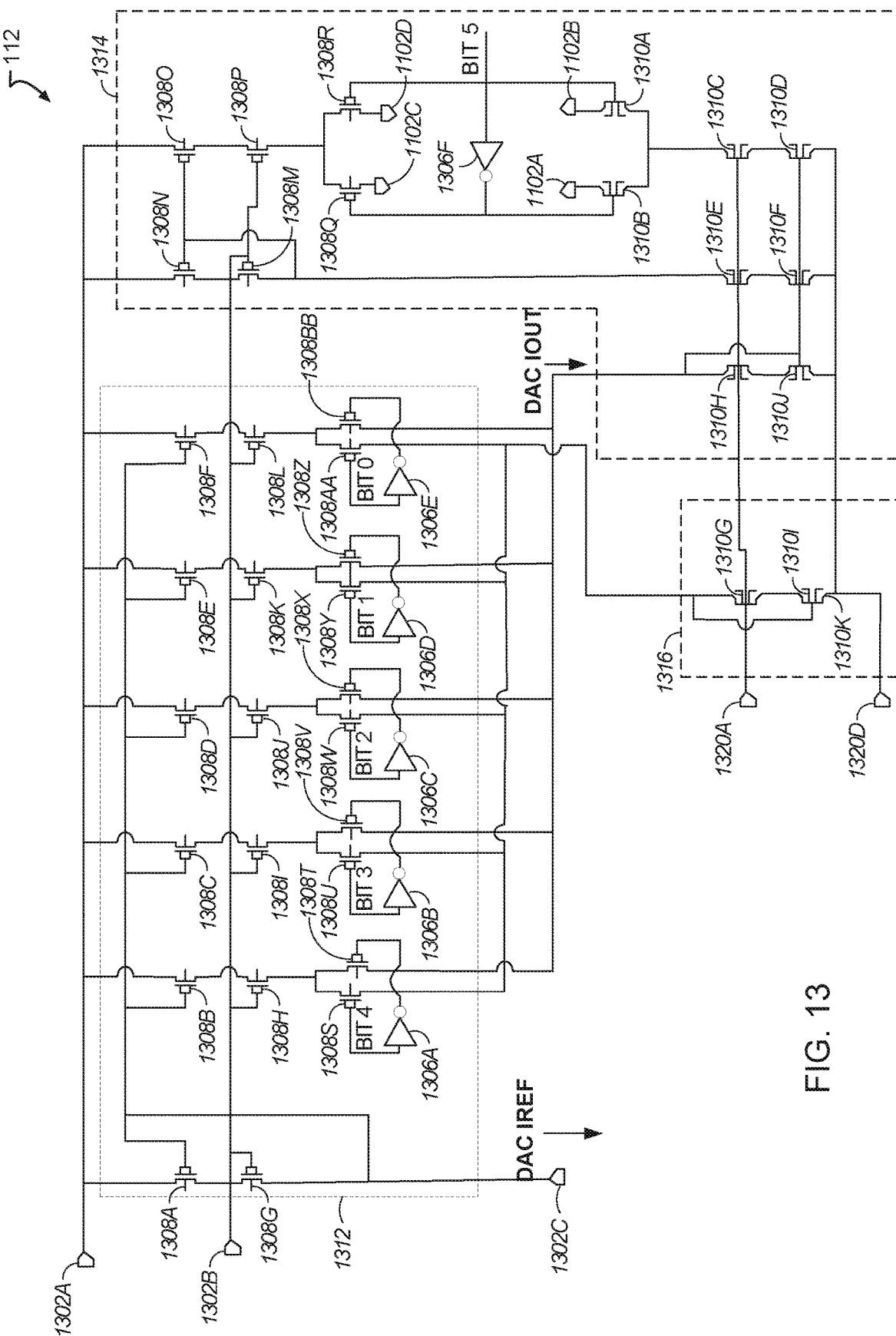
FIG. 13 illustrates, by way of example, a diagram of an embodiment of the DCOC DAC.

FIG. 13 illustrates, by way of example, a diagram of an embodiment of the DCOC DAC 112. The DCOC DAC 112 as illustrated includes a binary weighted current mode DAC 1312, an active output stage 1314, and a dummy output stage 1316.

Power input 1302A, a voltage reference input 1302B, and a current reference 1302C are provided to the binary weighted current mode DAC 1312. The binary weighted current mode DAC 1312 sources current to the active output stage 1314 and the dummy output stage 13116. The binary weighted current mode DAC 13112 includes current sources that provide a binary weighted current. For example, if the current source operating based on bit 0 produces about X Amps of current, the current source operating based on bit 1 produces about 2X Amps of current, the current source operating based on bit 2 produces about 4X Amps of current, the current source operating based on bit 3 produces about 8X Amps of current, and the current source operating based on bit 4 produces about 16X Amps of current.

The binary weighted current mode DAC 1312 includes switch devices (in the form of transistors) that control whether current will be sourced to the active output stage 1314 or the dummy output stage 1316. For example, consider the transistors 1308AA and 1308BB. The gates of these two transistors 3108AA and 1308BB are driven by complementary signals, such that one is driven high while the other is driven low (by a negate gate 1306E). If bit 0 of the m-bit DAC input 126 is "1", the gate of the transistor 1308BB is driven low and conducts current to the active output stage 1314. Each of the sets of transistors 1308Z and 1308Y, 1308X and 1308W, 1308V and 1308U, and 1308T and 1308S and respective negate gates 1306D, 1306C, 1306B, and 1306A coupled thereto perform similar operations. An amount of the correction provided by the output stage 1314 can be controlled by setting bits 0-4 accordingly. The transistors 1308A, 1308B, 1308C, 1308D, 1308E, 1308F, 1308G, 1308H, 1308I, 1308J, 1308K, and 1308L provide current multiplication for the binary weighted current mode DAC 1312.

The active output stage 1314 receives the power input 1302A, the voltage reference 1302B, and a bit from the digital logic (BIT 5). The bit determines whether the DCOC DAC 112 adjusts the output voltage/current in a positive direction or in a negative direction, such as is described regarding FIGS. 11 and 12. For example, if bit 5 is "0" then current is conducted through outputs 1308R and 1310B. In another example, if bit 5 is "1" then current is conducted through outputs 1310A and 1308Q.

The active output stage 1314 receives current from the binary weighted current mode DAC 1312 (DAC Tout). A current mirror comprised of transistors 1310H, 1310J, 1310E, and 1310F is complementary mirrored to a current mirror comprised of transistors 1308M, 1308N, 1308O, and 1308P.

The dummy output stage 1316 provides a sink for current that is not driven from the binary weighted current mode DAC 1312 to the active output stage 1314. The dummy output stage 1316 helps ensure that the currents and voltages sourced to the active output stage 1314 are not adversely affected by current of the DCOC DAC 112 that is not sourced to the active output stage 1314.

Figure 14:
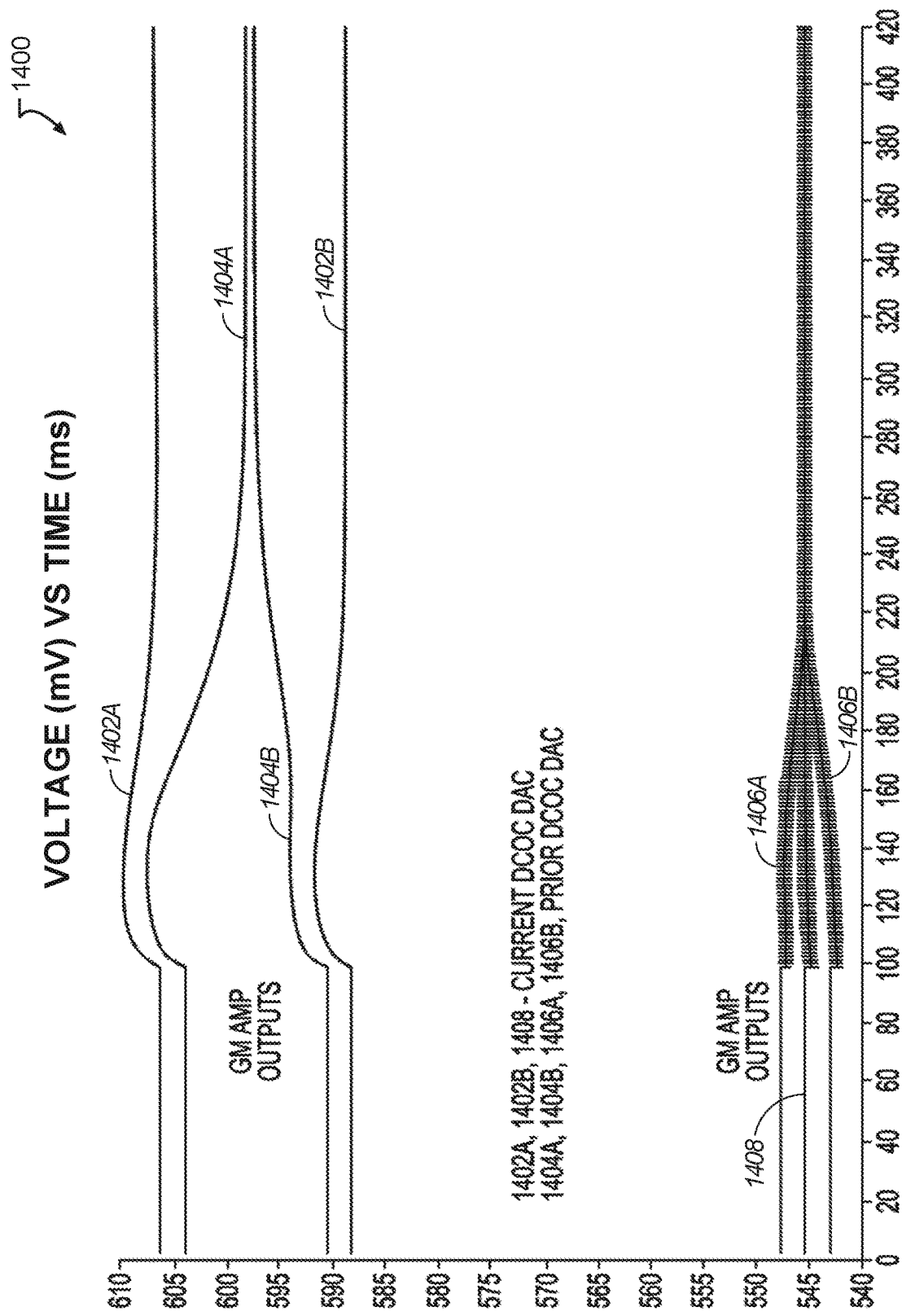
FIG. 14 illustrates, by way of example, a diagram of an embodiment of a graph of voltage versus time for inputs and outputs of prior amplifiers with DCOC and embodiments that include a DCOC DAC.

FIG. 14 illustrates, by way of example, a diagram of an embodiment of a graph 1400 of voltage versus time for inputs and outputs of prior amplifiers with DCOC and embodiments that include a DCOC DAC discussed herein. The lines 1404A and 1404B represent an output of the prior DCOC DAC in response to an input represented by lines 1406A and 1406B.

Previous DCOC solutions (represented by lines 1404A, 1404B, 1406A, and 1406B) applied the DCOC to the $g_m$ amplifier input as opposed to sources of transistors of the $g_m$ amplifier 104 as in embodiments herein. The graph 1400 compares the behavior of embodiments herein and previous DCOC solutions. The top lines 1402A, 1402B, 1404A, and 1404B represent at the $g_m$ amplifier outputs, centered at 600 mV. The lines 1406A, 1406B, and 1408A are the DC offset present at the $g_m$ amplifier inputs, centered at 550 mv. In the graph 1400 a mixer is disabled at 0 ns and then enabled at 100 ns. In the previous solution, the DC offset at the $g_m$ amplifier input and output decrease significantly after the mixer is activated and effectively remain unchanged in the invention as seen at lines 1406A and 1406B. The lines 1406A and 1406B show the DC offset being mitigated after the mixer is activated. This occurs because the impedance at the input of the $g_m$ amplifier reduces by orders of magnitude after the mixer is enabled. The loss of DC correction is also reflected on the $g_m$ amplifier output. With a mixer enabled, the DCOC DAC is required to output a current inversely proportional to the impedance change to maintain the same DC offset correction, consequently increasing current drain and die area.

The lines 1408, 1402A, and 1402B show the DC offset correction of embodiments. No DC offset is present on the $g_m$ amplifier input because the injection points of the DCOC DAC are isolated from the $g_m$ amplifier inputs. The DC offset at the $g_m$ amplifier output remains, though. The DCOC DAC 112, however, retains the output of the $g_m$ amplifier 104 after the mixer is enabled and the output filtering is settled. The impedance change on the $g_m$ amplifier input, due to the active mixer, has no effect on the final DC offset correction present on the $g_m$ amplifier outputs.

Placing the DCOC DAC injection points on the sources of the $g_m$ amplifier devices as opposed to the $g_m$ amplifier inputs, provides isolation to the mixer, thus rendering DC offset correction independent of the RF path. In addition, the DC offset can be independent of the gain trim, Embodiments reduce current drain and die area/cost compared to previous solutions.

Figure 15:
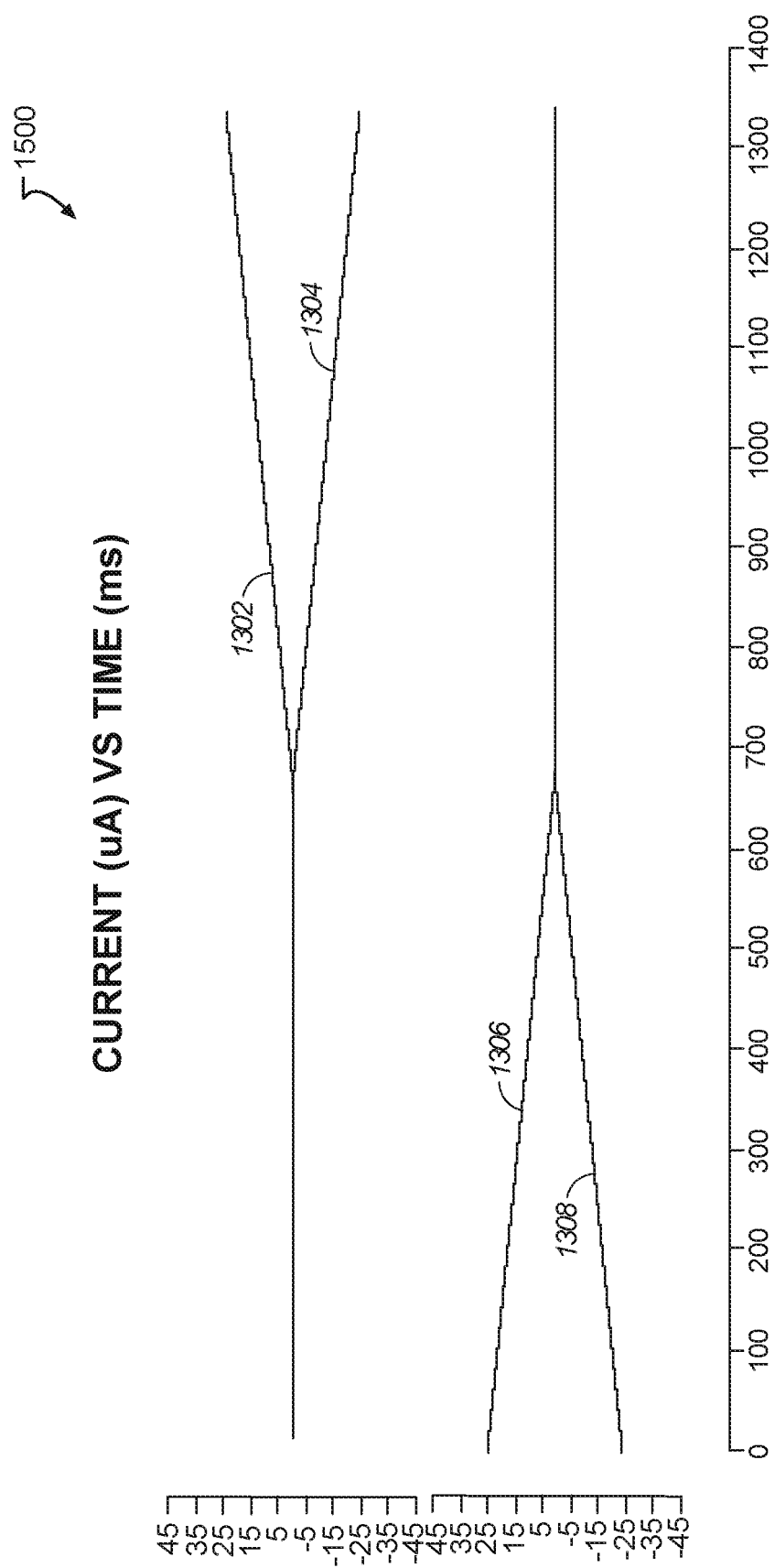
FIG. 15 illustrates, by way of example, a diagram of an embodiment of a graph 1500 of current versus time for outputs of the DCOC DAC.

FIG. 15 illustrates, by way of example, a diagram of an embodiment of a graph 1500 of current versus time for outputs of the DCOC DAC 112 discussed herein. The graph 1500 illustrates output of the DCOC DAC 112 in operation. The four individual DAC outputs are plotted as lines 1302, 1304, 1306, and 1308. The DAC input word is swept from 0 to 63. A code word of about 31-32 centers the DCOC DAC 112. The DAC input in the embodiments illustrated are unsigned binary coded decimal (BCD). In the plot, the pair of positive adjustment source/sink outputs are represented by lines 1302 and 1304 and the pair of negative adjustment source/sink outputs are represented by lines 1306 and 1308. The outputs of the DCOC DAC 112 are described in Table 3.

TABLE 3

| CODE WORD | OUT 1 SOURCE (+) IOUT | OUT 2 SOURCE (−) IOUT | OUT 3 SINK (+) IOUT | OUT 4 SINK (−) IOUT | ACTION | AMP OUTPUT |
|---|---|---|---|---|---|---|
| 0 | 0 | −16 uA | 0 | −16 uA | MAX (−) DCOC | −32 mV |
| 16 | 0 | −8 uA | 0 | −8 uA | | −16 mV |
| 32 | 0 | 0 | 0 | 0 | ZERO DCOC | 0 |
| 48 | 8 uA | 0 | 8 uA | 0 | | +16 mV |
| 63 | 16 uA | 0 | 16 uA | 0 | MAX (+) DCOC | +32 mV |

At code 0, the pair of negative source/sink outputs are at the maximum negative output value. As the code word increases, the output current in each of the negative outputs decreases and reaches zero at about code word 32 and stays zero for all code words equal to or greater than 32. Conversely, at code 63, the pair of plus source/sink outputs are at the maximum positive output value. As the code word decreases, the output current at each positive output decreases and reaches zero at about code word 32 and stays zero for all code words equal to or less than 32. The current from outputs of the DCOC DAC 112 flow through the load, placed across the $g_m$ amplifier output, producing a DC voltage whose polarity and magnitude are a function of the code word provided to the DCOC DAC 112 by the digital logic 110. At about code word 32, the DCOC DAC 112 with all four current outputs is about zero providing no DC offset. Note that the code word values can configure the DCOC DAC 112 to source/sink positive/negative amounts of current at different values, such as by switching polarity of transistors (e.g., an NPN for PNP and vice versa).

Higher-Level System Overview

Figure 16:
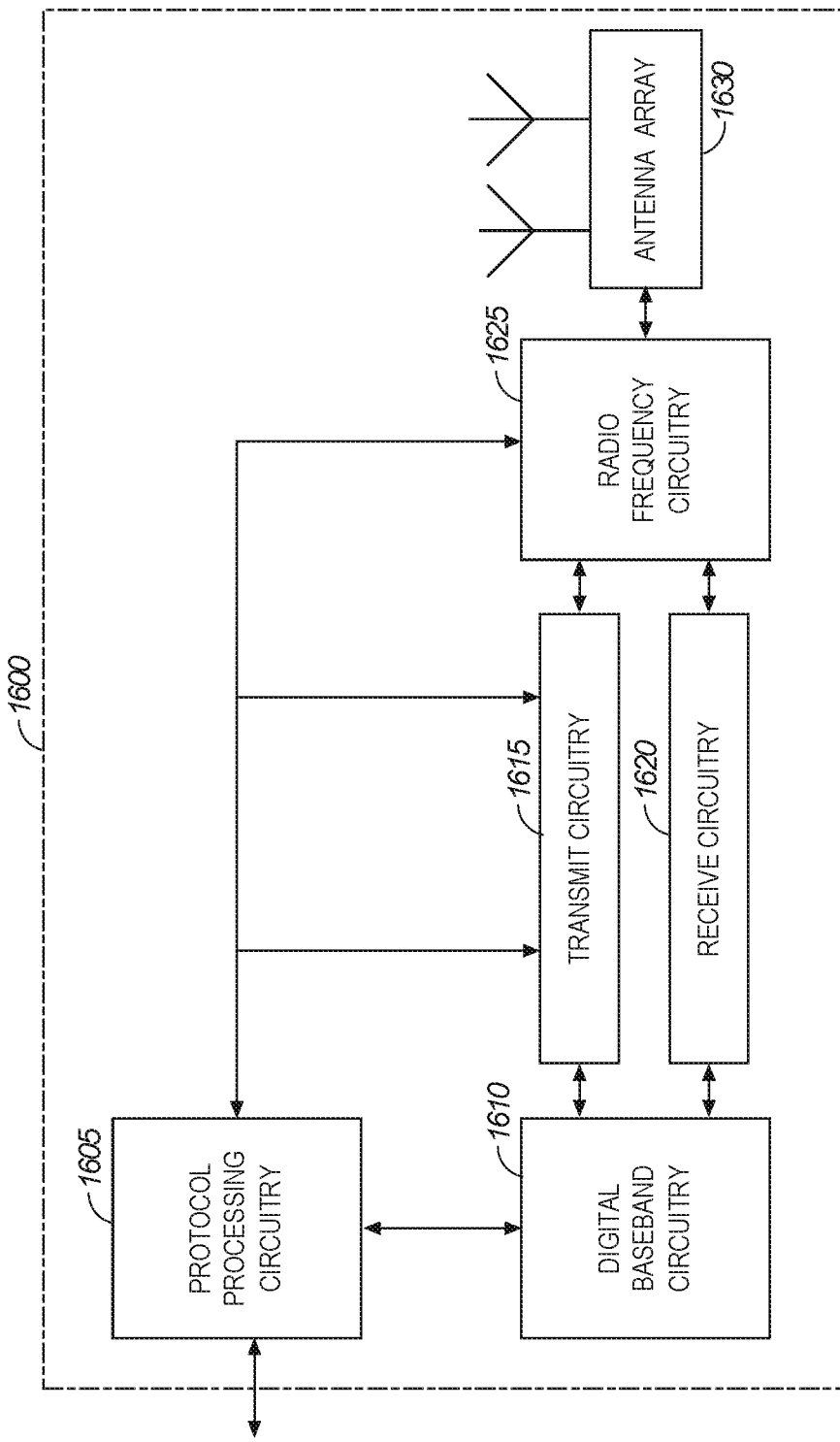
FIG. 16 illustrates, by way of example, a diagram of an embodiment of millimeter wave communication circuitry.

FIG. 16 illustrates, by way of example, a diagram of an embodiment of millimeter wave (mmWave) communication circuitry. The mmWave communication circuitry 1600 may include protocol processing circuitry 1605 (or processor) or other means for processing. Protocol processing circuitry 1605 may implement one or more of medium access control (MAC), radio link control (RLC), packet data convergence protocol (PDCP), radio resource control (RRC) and non-access stratum (NAS) functions, among others. Protocol processing circuitry 1605 may include one or more processing cores to execute instructions and one or more memory structures to store program and data information.

The mmWave communication circuitry 1600 may further include digital baseband circuitry 1610. Digital baseband circuitry 1610 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

The mmWave communication circuitry 1600 may further include transmit circuitry 1615, receive circuitry 1620 and/or antenna array circuitry 1630. The mmWave communication circuitry 1600 may further include RF circuitry 1625. In some embodiments, RF circuitry 1625 may include one or multiple parallel RF chains for transmission and/or reception. Each of the RF chains may be connected to one or more antennas of antenna array circuitry 1630.

In some embodiments, protocol processing circuitry 1605 may include one or more instances of control circuitry. The control circuitry may provide control functions for one or more of digital baseband circuitry 1610, transmit circuitry 1615, receive circuitry 1620, and/or RF circuitry 1625.

Figure 17:
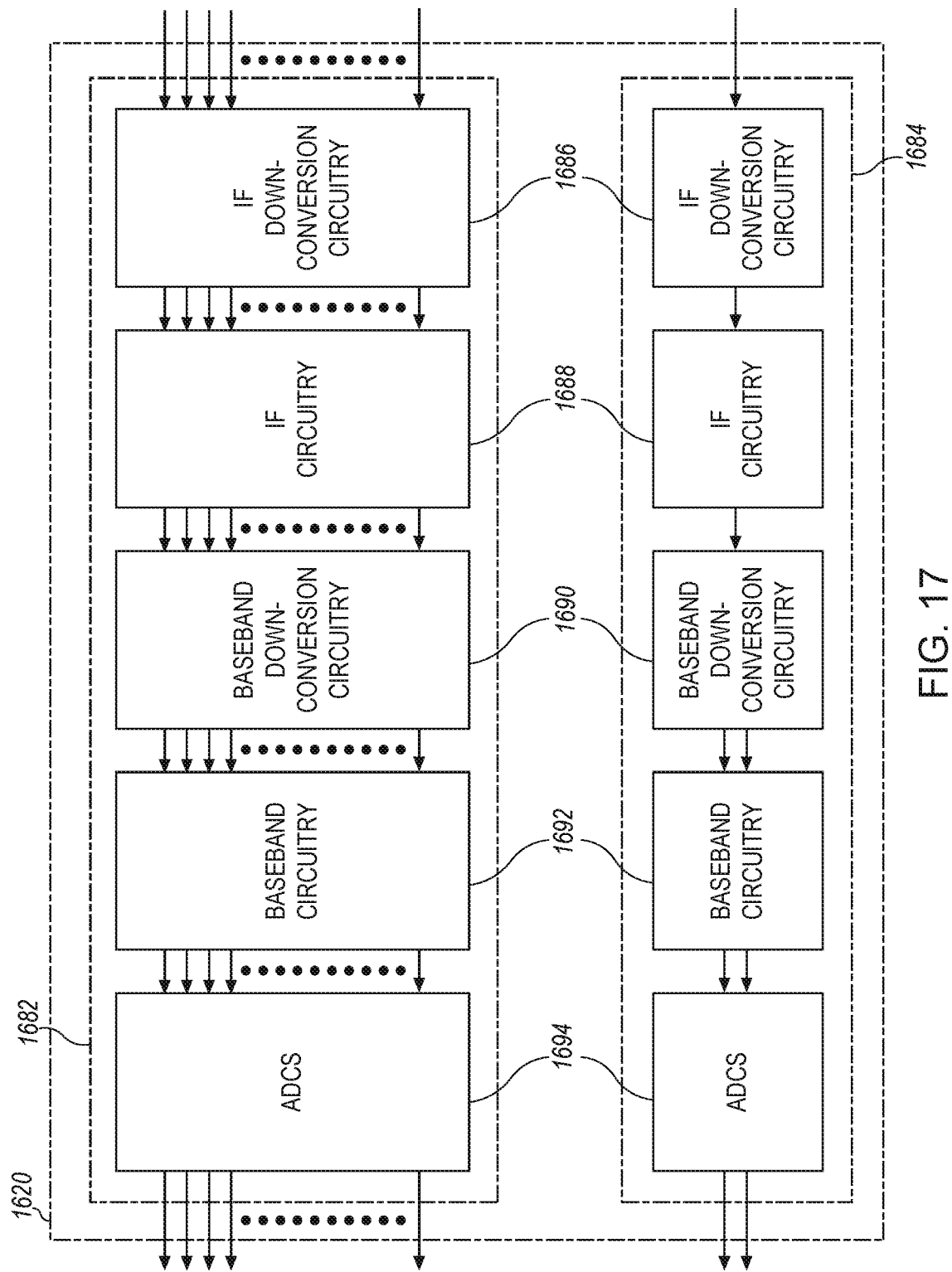
FIG. 17 illustrates, by way of example, a diagram of an embodiment of receive circuitry in FIG. 16.

FIG. 17 illustrates, by way of example, a diagram of an embodiment of receive circuitry in FIG. 16. The receive circuitry 1620 may include one or more of parallel receive circuitry 1682 and/or one or more of combined receive circuitry 1684. In some embodiments, the one or more parallel receive circuitry 1682 and one or more combined receive circuitry 1684 may include one or more Intermediate Frequency (IF) down-conversion circuitry 1686, IF processing circuitry 1688, baseband down-conversion circuitry 1690, baseband processing circuitry 1692 and analog-to-digital converter (ADC) circuitry 1694. As used herein, the term "intermediate frequency" refers to a frequency to which a carrier frequency (or a frequency signal) is shifted as in intermediate step in transmission, reception, and/or signal processing. IF down-conversion circuitry 1686 may convert received RF signals to IF. IF processing circuitry 1688 may process the IF signals, e.g., via filtering and amplification. Baseband down-conversion circuitry 1690 may convert the signals from IF processing circuitry 1688 to baseband. Baseband processing circuitry 1692 may process the baseband signals, e.g., via filtering and amplification. ADC circuitry 1694 may convert the processed analog baseband signals to digital signals.

Example Computer System Implementations:

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

A processor subsystem may be used to execute the instruction on the machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors to carry out the operations described herein. Modules may be hardware modules, and as such, modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term "hardware module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Figure 18:
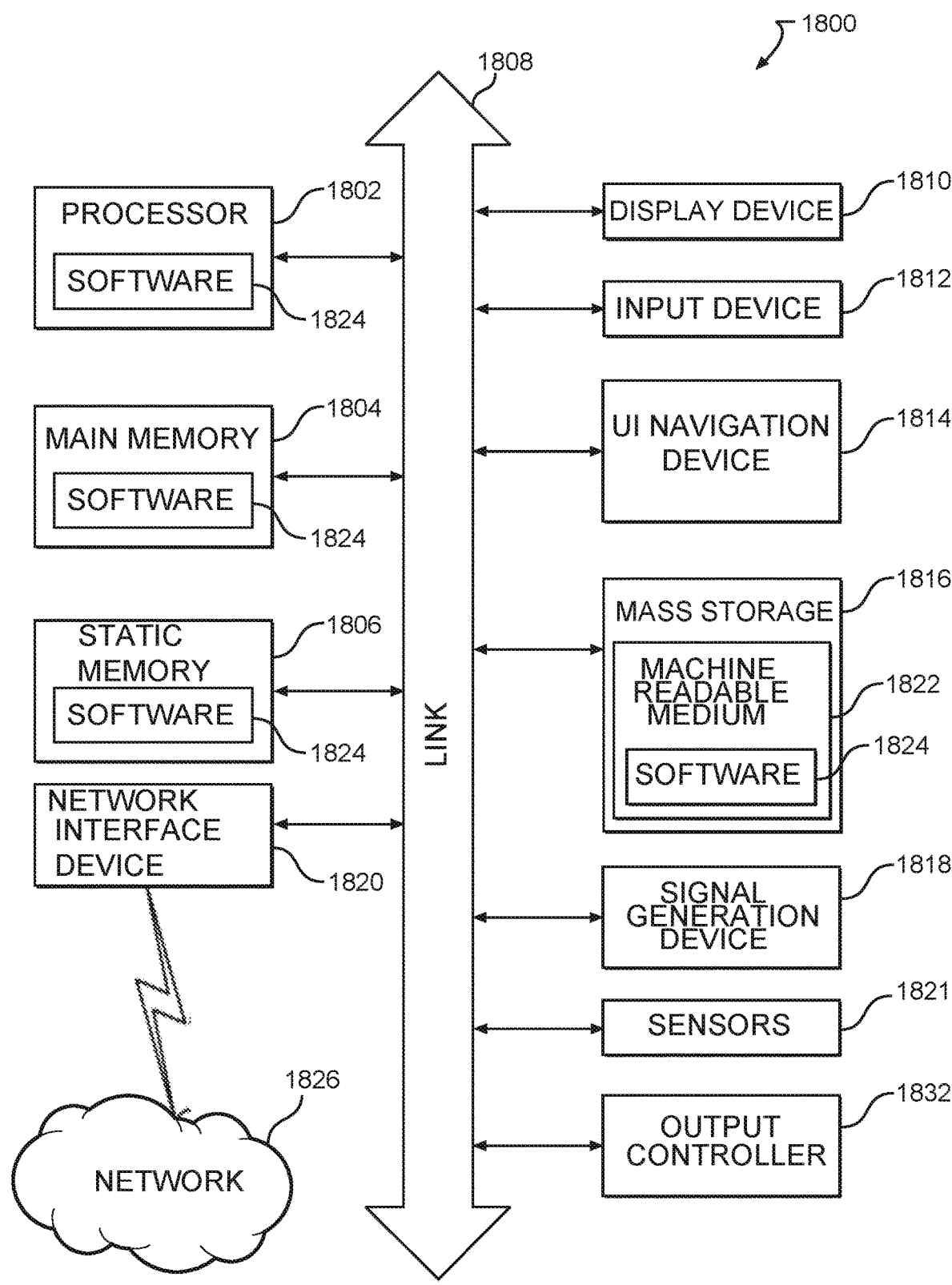
FIG. 18 is a block diagram illustrating a machine in the example form of a computer system, within which a set or sequence of instructions may be executed to cause the machine to perform any one of the methodologies discussed herein, according to an example embodiment.

FIG. 18 is a block diagram illustrating a machine in the example form of a computer system 1800, within which a set or sequence of instructions may be executed to cause the machine to perform any one of the methodologies discussed herein, according to an example embodiment. For example, the method described above with reference to other FIGS. may be performed using at least a portion of the computer system 1800. In another example, circuitry of the FIGS. described above can be included in or be a part of the computer system 1800.

In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be an onboard vehicle system, an ADAS, an apparatus of an autonomous driving vehicle, a wearable device, a personal computer (PC), a tablet PC, a hybrid tablet, a personal digital assistant (PDA), a mobile telephone (e.g., a smartphone), or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein. For instance, a portion of the computer system 1800 can execute instructions to perform the method described above.

Example computer system 1800 includes at least one processor 1802 (e.g., a central processing unit (CPU), a graphics processing unit (GPU) or both, processor cores, compute nodes, etc.), a main memory 1804 and a static memory 1806, which communicate with each other via a link 1808 (e.g., bus). The computer system 1800 may further include a video display device 1810, an input device 1812 (e.g., an alphanumeric input device such as keyboard or keypad, a touchpad, a microphone, a camera, or components of a virtual reality/VR headset such as buttons), and a user interface (UI) navigation device 1814 (e.g., a mouse, a stylus, or a pointing device). In one embodiment, the video display device 1810, input device 1812 and UI navigation device 1814 are incorporated into a touch screen display (e.g., a touch sensitive display device).

The computer system 1800 may additionally include a storage device 1816 (e.g., a drive unit), a signal generation device 1818 (e.g., a speaker), a network interface device 1820, and one or more sensors 1821, such as an RFID reader, a global positioning system (GPS) sensor, a camera, a compass, an accelerometer, a gyrometer, a magnetometer, or other sensors. The computer system 1800 may also include an output controller 1832, such as a serial (e.g., universal serial bus (USB), parallel, or other wired or wireless (e.g., IR, near field communication (NFC), etc.) connection to communicate or control one or more peripheral devices (e.g., a printer, card reader, etc.). In some embodiments, the processor 1802 or instructions 1824 (e.g., software in the example shown in FIG. 18) comprises processing circuitry or transceiver circuitry. The processing circuitry may include one or electric or electronic components, such as one or more transistors, resistors, capacitors, inductors, diodes, regulators, analog to digital converters, digital to analog converters, logic gates (e.g., AND, OR, NAND, NOR, XOR, or other logic gates), multiplexers, modulators, switch devices, power supplies, or the like.

The storage device 1816 includes a machine-readable medium 1822 on which is stored one or more sets of data structures and instructions 1824 (e.g., software) embodying or utilized by any one or more of the methodologies or functions described herein. For example, the computer system 1800 may execute instructions 1824 to perform the method described above with reference to FIG. 2.

The instructions 1824 may also reside, completely or at least partially, within the main memory 1804, static memory 1806, or within the processor 1802 during execution thereof by the computer system 1800, with the main memory 1804, static memory 1806, and the processor 1802 also constituting machine-readable media 1822.

While the machine-readable medium 1822 is illustrated in an example embodiment to be a single medium, the term "machine-readable medium" may include a single medium or multiple media (e.g., a centralized or distributed database, or associated caches and servers) that store the one or more instructions 1824. The term "machine-readable medium" shall also be taken to include any tangible medium that can store, encode, or carry instructions 1824 for execution by the machine and that cause the machine to perform any one or more of the methodologies of the present disclosure or that can store, encoding or carrying data structures utilized by or associated with such instructions 1824. The term "machine-readable medium" shall accordingly be taken to include, but not be limited to, solid-state memories, and optical and magnetic media. Specific examples of machine-readable media 1822 include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 1824 may further be transmitted or received over a communications network 1826 using a transmission medium via the network interface device 1820 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G, and 4G LTE/LTE-A or WiMAX networks). The network interface device 1820 may transmit and receive data over a transmission medium, which may be wired or wireless (e.g., radio frequency, infrared or visible light spectra, etc.), fiber optics, or the like, to network 1826.

Network interface device 1820, according to various an embodiments, may take any suitable form factor. In one such embodiment, network interface device 1820 is in the form of a network interface card (NIC) that interfaces with processor 1802 via link 1808. In one example, link 1808 includes a PCI Express (PCIe) bus, including a slot into which the NIC form-factor may removably engage. In another embodiment, network interface device 1820 is a network interface circuit laid out on a motherboard together with local link circuitry, processor interface circuitry, other input/output circuitry, memory circuitry, storage device and peripheral controller circuitry, and the like. In another embodiment, network interface device 1820 is a peripheral that interfaces with link 1808 via a peripheral input/output port such as a universal serial bus (USB) port.

EXAMPLES

Example 1 is a digital to analog converter (DAC) can include a current mode DAC to receive an OC word from digital logic indicating an amount of current to add to or remove from sources of respective transistors of an amplifier and generate a current based on the OC word, an active output stage including a positive current mirror and a negative current mirror to generate a positive current and a negative current based on at least a portion of the generated current, and a plurality of outputs including a plurality of sink outputs and a plurality of source outputs to provide the positive and negative currents to the sources of the respective transistors.

In Example 2, Example 1 can further include a dummy output stage to receive at least another portion of the generated current and sink or source excess current from the current mode DAC that is not provided to the active output stage.

In Example 3, at least one of Examples 1-2 can further include, wherein the current mode DAC receives a subset of the OC word and the active output stage receives a bit of the OC word not in the subset.

In Example 4, Example 3 can further include, wherein the bit of the OC word not in the subset indicates a polarity of the current to be generated by the active output stage.

In Example 5, at least one of Examples 2-4 can further include, wherein the current mode DAC includes first and second switch devices electrically coupled in parallel, wherein the first switch device, when closed, conducts current to the dummy output stage and the second switch device, when closed, conducts current to the active output stage.

In Example 6, at least one of Examples 1-5 can further include, wherein the active output stage includes two sink devices in parallel and two source devices in parallel, the two sink devices electrically coupled to receive the negative current and the two source devices electrically coupled to receive the positive current.

In Example 7, Example 6 can further include, wherein the active output stage includes a negate device to provide a complement of a bit of the OC word and is electrically coupled to provide the complement to a gate of a first sink device of the sink devices and a gate of a first source device of the source devices.

Example 8 includes a system comprising an amplifier comprising a first pair of transistors, including a first transistor and a second transistor, electrically coupled to a first input of a differential input; and a second pair of transistors, including a third transistor and a fourth transistor, electrically coupled to a second input of the differential input, and a DAC, the DAC comprising a current mode DAC electrically coupled to receive an OC word from digital logic indicating an amount of current to sink from or source to the first and second pairs of transistors and generate a current based on a subset of the OC word, an active output stage to generate a positive current and a negative current based on at least a portion of the generated current, and a plurality of outputs including a plurality of sink outputs and a plurality of source outputs, the two sink outputs including a first sink output and a second sink output electrically coupled to sources of and sink current from the first and third transistors, respectively, and two source outputs including a first source output and a second source output electrically coupled to sources of and source current to the second and fourth transistors, respectively.

In Example 9, Example 8 can further include, wherein the first input is electrically coupled to gates of the first and second transistors, the second input electrically coupled to gates of the second and fourth transistors, a drain of the first transistor is electrically coupled to a drain of the second transistor, and a drain of the third transistor is electrically coupled to a drain of the fourth transistor.

In Example 10, at least one of Examples 8-9 can further include, wherein the amplifier includes a differential output including a first output and a second output, wherein the first output is electrically coupled to the drain of the first transistor and the second output is electrically coupled to the drain of the third transistor.

In Example 11, at least one of Examples 8-10 can further include, wherein the DCOC DAC further includes a dummy output stage to receive at least another portion of the generated current and sink or source current from the current mode DAC that is not provided to the active output stage.

In Example 12, at least one of Examples 8-11 can further include, wherein the current mode DAC receives the subset of the OC word and the active output stage receives a bit of the OC word not in the subset.

In Example 13, Example 12 can further include, wherein the bit of the OC word not in the subset indicates a polarity of the current to be generated by the active output stage.

In Example 14, at least one of Examples 11-13 can further include, wherein the current mode DAC includes first and second switch devices electrically coupled in parallel, wherein the first switch device, when closed, conducts current to the dummy output stage and the second switch device, when closed, conducts current to the active output stage.

In Example 15, at least one of Examples 8-14 can further include, wherein the active output stage includes two sink devices in parallel and two source devices in parallel, the two sink devices electrically coupled to receive the negative current and the two source devices electrically coupled to receive the positive current.

In Example 16, Example 15 can further include, wherein the active output stage includes a negate device electrically coupled to provide a complement of a bit of the OC word and is electrically coupled to provide the complement to a first sink device of the sink devices and a first source device of the source devices.

Example 17 includes a method of direct current (DC) offset correction (OC) comprising receiving, at a current mode digital to analog converter (DAC) of a DCOC DAC and from digital logic, an OC word indicating an amount of current to source to or sink from sources of respective transistors of an amplifier, generating, by the current mode DAC, a current based on the OC word, generating, by an active output stage including a positive current mirror and a negative current mirror, a positive current and a negative current based on at least a portion of the generated current, and providing, by four outputs of the DCOC DAC including two sink outputs and two source outputs, the positive and negative currents to the sources of the respective transistors.

In Example 18, Example 17 can further include receiving, by a dummy output stage, at least another portion of the generated current, and sinking, by the dummy output stage, excess current from the current mode DAC that is not provided to the active output stage.

In Example 19, at least one of Examples 17-18 can further include, wherein the OC word received at the current mode DAC is a subset of a complete OC word and the method further comprises receiving, at the active output stage, a bit of the complete OC word not in the subset.

In Example 20, Example 19 can further include controlling, by the active output stage and based on the bit, a polarity of the current generated by the active output stage.

In Example 21, at least one of Examples 18-20 can further include, wherein the current mode DAC includes first and second switch devices electrically coupled in parallel, and the method further comprises at least one of (a) closing the first switch device and opening the second switch device to conduct current to the dummy output stage and (b) opening the first switch device and closing the second switch device to conduct current to the dummy output stage.

In Example 22, at least one of Examples 17-21 can further include, wherein the active output stage includes two sink devices in parallel and two source devices in parallel, and the method further comprises receiving, at sources of the two sink devices, the negative current and receiving, at sources of the two source devices the positive current.

In Example 23, Example 22 can further include, wherein the active output stage includes a negate device, and the method further comprises providing, by the negate device, a complement of a bit of the OC word to a gate of a first sink device of the sink devices and a gate of a first source device of the source devices.

Example 24 includes an automatic gain control (AGC) and filter system comprising a variable capacitor, automatic gain control (AGC) units electrically coupled in series to each other and electrically coupled in parallel to the variable capacitor, each AGC unit of the AGC units including impedance devices electrically coupled in parallel with the variable capacitor, and switch devices electrically coupled between the impedance devices so that an impedance of the impedance devices remains constant whether the switch devices are open or closed.

In Example 25, Example 24 can further include, wherein the impedance devices include first, second, third and fourth impedance devices, the first impedance device is electrically coupled at a first end to a first input and in series with another AGC unit, a second impedance device electrically coupled at a first end to a second input and in series with the other AGC unit, a third impedance device electrically coupled at a first end to a second end of the first impedance device and in parallel with the other AGC unit, and a fourth impedance device electrically coupled at a first end to a second end of the second impedance device and in parallel with the other AGC unit.

In Example 26, Example 25 can further include, wherein the switch devices include a first switch device, and the first switch device is electrically coupled between second ends of the third and fourth impedance devices so that, when the switch device is closed, the third and fourth impedance devices are electrically coupled in series to each other and in parallel to other AGC units.

In Example 27, Example 26 can further include, wherein the switch devices include a second switch device, and the second switch device is electrically coupled to the second end of the third impedance device so that, when the second switch device is closed, the second end of the third impedance device is output to the other AGC unit.

In Example 28, Example 27 can further include, wherein the switch devices include a third switch device, and the third switch device electrically coupled to the second end of the fourth impedance device so that, when the third switch device is closed, the second end of the fourth impedance device is output to the other AGC unit.

In Example 29, Example 28 can further include digital logic electrically coupled to provide a control bit to the first switch device to control whether the first switch device is open or closed and a negate device electrically coupled to receive the control and provide a complement version of the control bit to the second and third switch devices.

In Example 30, Example 29 can further include, wherein the digital logic is further electrically coupled to provide a trim word to the variable capacitor to control an impedance value of the variable capacitor.

In Example 31, Example 30 can further include a fourth switch device electrically coupled such that in a first state, the variable capacitor is in an electrical path of the first and second inputs and in a second state, the variable capacitor is not in an electrical path of the first and second inputs.

In Example 32, at least one of Examples 24-31 can further include an amplifier electrically coupled to provide the first and second inputs.

In Example 33, Example 32 can further include, wherein the amplifier is a transconductance amplifier.

Example 34 includes a method of trimming a capacitor of an automatic gain control and filter system comprising altering a state of a switch device electrically coupled to the capacitor to electrically bypass the capacitor, with the capacitor electrically bypassed, recording an output of the AGC and filter system to an oscillating signal input, altering the state of the switch device to put the capacitor in the electrical path of the oscillating signal input, with the capacitor in the electrical path and for each trim value of a plurality of trim values for the capacitor, recording an output of the AGC and filter system to the oscillating signal input, comparing the recorded output of the AGC and filter system to a specified target value, and setting, by digital logic electrically coupled to the capacitor, a trim value of the capacitor to the trim value closest to the specified target value.

In Example 35, Example 34 can further include powering off a radio frequency (RF) front end electrically coupled to an input of the AGC and filter system before electrically bypassing the capacitor.

In Example 36, at least one of Examples 34-35 can further include amplifying, by an amplifier electrically coupled between the digital logic and the AGC and filter system, the oscillating signal.

In Example 37, Example 36 can further include digitizing, using a direct current offset correction (DCOC) digital to analog controller (DAC) electrically coupled between the digital logic and the amplifier, the oscillating signal.

In Example 38, Example 37 can further include, wherein outputs of the DCOC DAC are electrically connected to respective sources of respective transistors of the amplifier.

In Example 39, at least one of Examples 34-38 can further include looking up the recorded value in a lookup table detailing trim values for a plurality of operation frequencies and wherein setting the trim value of the capacitor includes determining a trim value corresponding to a different operation frequency of the operation frequencies in a same column as the trim value of the capacitor.

In Example 40, at least one of Examples 35-39 can further include converting, by an analog to digital converter (ADC) electrically coupled between the AGC and filter system and the digital logic, the output of the AGC and filter system to a digital word, and wherein recording the output of the AGC and filter system includes recording the digital word.

Example 41 includes a radio receiver system comprising an amplifier to amplify a radio frequency (RF) input from an RF front end, an automatic gain control (AGC) and filter system electrically coupled to receive the amplified RF input, the AGC and filter system comprising a variable capacitor, AGC units electrically coupled in series to each other and electrically coupled in parallel to the variable capacitor, each AGC unit of the AGC units including impedance devices electrically coupled in parallel with the variable capacitor, and switch devices electrically coupled between the impedance devices so that an impedance of the impedance devices remains constant independent of a state of the switch devices.

In Example 42, Example 41 can further include digital logic circuitry electrically coupled between an output of the AGC and filter system and the amplifier, the digital logic to control a trim value of the variable capacitor.

In Example 43, Example 42 can further include, wherein controlling the trim value includes altering a state of a first switch device of the switch devices electrically coupled to the variable capacitor to electrically bypass the capacitor, with the variable capacitor electrically bypassed, recording an output of the AGC and filter system to an oscillating signal input, altering the state of the first switch device to put the variable capacitor in the electrical path of the oscillating signal input, with the variable capacitor in the electrical path and for each trim value of a plurality of trim values for the variable capacitor, recording an output of the AGC and filter system to the oscillating signal input, comparing the recorded output of the AGC and filter system to a specified target value, and setting, by digital logic electrically coupled to the variable capacitor, a trim value of the capacitor to the trim value closest to the specified target value.

In Example 44, at least one of Examples 41-43 can further include, wherein the digital logic is further to power off an RF front end electrically coupled to an input of the AGC and filter system before electrically bypassing the variable capacitor.

In Example 45, at least one of Examples 41-44 can further include a direct current offset correction (DCOC) digital to analog controller (DAC) electrically coupled between the digital logic and the amplifier.

In Example 46, Example 45 can further include, wherein outputs of the DCOC DAC are electrically connected to respective sources of respective transistors of the amplifier.

In Example 47, at least one of Examples 41-46 can further include, wherein the digital logic is further to convert, by an analog to digital converter (ADC) electrically coupled between the AGC and filter system and the digital logic, the output of the AGC and filter system to a digital word, and wherein recording the output of the AGC and filter system includes recording the digital word.

In Example 48, at least one of Examples 41-47 can further include, wherein the impedance devices include first, second, third and fourth impedance devices, the first impedance device is electrically coupled at a first end to a first input and in series with another AGC unit, a second impedance device electrically coupled at a first end to a second input and in series with the other AGC unit, a third impedance device electrically coupled at a first end to a second end of the first impedance device and in parallel with the other AGC unit, and a fourth impedance device electrically coupled at a first end to a second end of the second impedance device and in parallel with the other AGC unit.

In Example 49, Example 48 can further include, wherein the switch devices further include a second switch device, and the second switch device is electrically coupled between second ends of the third and fourth impedance devices so that, when the second switch device is in a closed state, the third and fourth impedance devices are electrically coupled in series to each other and in parallel to other AGC units.

In Example 50, Example 49 can further include, wherein the switch devices further include a third switch device, and the third switch device is electrically coupled to the second end of the third impedance device so that, when the third switch device is in a closed state, the second end of the third impedance device is output to the other AGC unit.

In Example 51, Example 50 can further include, wherein the switch devices further include a fourth switch device, and the fourth switch device is electrically coupled to the second end of the fourth impedance device so that, when the fourth switch device is in a closed state, the second end of the fourth impedance device is output to the other AGC unit.

In Example 52, Example 51 can further include digital logic electrically coupled to provide a control bit to the second switch device to control whether the second switch device is in an open or closed state, and a negate device electrically coupled to receive the control and provide a complement version of the control bit to the third and fourth switch devices.

In Example 53, at least one of Examples 41-52 can further include, wherein the amplifier is a transconductance amplifier.

Additional Notes:

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more embodiments thereof), either with respect to a particular example (or one or more embodiments thereof), or with respect to other examples (or one or more embodiments thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more embodiments thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A digital to analog converter (DAC), comprising:
    a current mode DAC to receive an offset correction (OC) digital word from digital logic indicating an amount of current to add to or remove from sources of respective transistors of an amplifier and generate a current based on the OC digital word;
    an active output stage including a positive current mirror and a negative current mirror to generate a positive current and a negative current based on at least a portion of the generated current; and
    a plurality of outputs including a plurality of sink outputs and a plurality of source outputs to provide the positive and negative currents to the sources of the respective transistors.

2. The DAC of claim 1, further comprising:
    a dummy output stage to receive at least another portion of the generated current and sink or source excess current from the current mode DAC that is not provided to the active output stage.

3. The DAC of claim 1, wherein the current mode DAC receives a subset of the OC digital word and the active output stage receives a bit of the OC digital word not in the subset.

4. The DAC of claim 3, wherein the bit of the OC digital word not in the subset indicates a polarity of the current to be generated by the active output stage.

5. The DAC of claim 2, wherein the current mode DAC includes first and second switch devices electrically coupled in parallel, wherein the first switch device, when closed, conducts current to the dummy output stage and the second switch device, when closed, conducts current to the active output stage.

6. The DAC of claim 1, wherein the active output stage includes two sink devices in parallel and two source devices in parallel, the two sink devices electrically coupled to receive the negative current and the two source devices electrically coupled to receive the positive current.

7. The DAC of claim 6, wherein the active output stage includes a negate device to provide a complement of a bit of the OC digital word and is electrically coupled to provide the complement to a gate of a first sink device of the sink devices and a gate of a first source device of the source devices.

8. A system comprising:
    an amplifier comprising:
        a first pair of transistors, including a first transistor and a second transistor, electrically coupled to a first input of a differential input; and
        a second pair of transistors, including a third transistor and a fourth transistor, electrically coupled to a second input of the differential input; and a DAC comprising:
  a current mode DAC electrically coupled to receive an offset correction (OC) digital word from digital logic indicating an amount of current to sink from or source to the first and second pairs of transistors and generate a current based on a subset of the OC digital word;
  an active output stage to generate a positive current and a negative current based on at least a portion of the generated current; and
  a plurality of outputs including a plurality of sink outputs and a plurality of source outputs, the plurality of sink outputs including a first sink output and a second sink output electrically coupled to sources of and sink current from the first and third transistors, respectively, and a plurality of source outputs including a first source output and a second source output electrically coupled to sources of and source current to the second and fourth transistors, respectively.

9. The system of claim 8, wherein the first input is electrically coupled to gates of the first and second transistors, the second input electrically coupled to gates of the second and fourth transistors, a drain of the first transistor is electrically coupled to a drain of the second transistor, and a drain of the third transistor is electrically coupled to a drain of the fourth transistor.

10. The system of claim 8, wherein the amplifier includes a differential output including a first output and a second output, wherein the first output is electrically coupled to a drain of the first transistor and the second output is electrically coupled to a drain of the third transistor.

11. The system of claim 8, wherein the DAC further includes:
  a dummy output stage to receive at least another portion of the generated current and sink or source current from the current mode DAC that is not provided to the active output stage.

12. The system of claim 8, wherein the current mode DAC receives the subset of the OC digital word and the active output stage receives a bit of the OC digital word not in the subset.

13. The system of claim 12, wherein the bit of the OC digital word not in the subset indicates a polarity of the current to be generated by the active output stage.

14. The system of claim 11, wherein the current mode DAC includes first and second switch devices electrically coupled in parallel, wherein the first switch device, when closed, conducts current to the dummy output stage and the second switch device, when closed, conducts current to the active output stage.

15. The system of claim 8, wherein the active output stage includes two sink devices in parallel and two source devices in parallel, the two sink devices electrically coupled to receive the negative current and the two source devices electrically coupled to receive the positive current.

16. A method of direct current (DC) offset correction (OC) comprising:
  receiving, at a current mode digital to analog converter (DAC) of a DCOC DAC and from digital logic, an OC digital word indicating an amount of current to source to or sink from sources of respective transistors of an amplifier;
  generating, by the current mode DAC, a current based on the OC digital word;
  generating, by an active output stage including a positive current mirror and a negative current mirror, a positive current and a negative current based on at least a portion of the generated current; and
  providing, by a plurality of outputs of the DCOC DAC including a plurality of sink outputs and a plurality of source outputs, the positive and negative currents to the sources of the respective transistors.

17. The method of claim 16, further comprising:
  receiving, by a dummy output stage, at least another portion of the generated current; and
  sinking, by the dummy output stage, excess current from the current mode DAC that is not provided to the active output stage.

18. The method of claim 16, wherein the OC digital word received at the current mode DAC is a subset of a complete OC digital word, wherein the complete OC digital word comprises one or more bits including a bit of the OC digital word not in the subset, and wherein the method further comprises receiving, at the active output stage, the bit of the complete OC digital word not in the subset.

19. The method of claim 18, further comprising controlling, by the active output stage and based on the bit, a polarity of the current generated by the active output stage.

20. The method of claim 17, wherein the current mode DAC includes first and second switch devices electrically coupled in parallel, and the method further comprises at least one of (a) closing the first switch device and opening the second switch device to conduct current to the dummy output stage and (b) opening the first switch device and closing the second switch device to conduct current to the dummy output stage.

* * * * *